(12) United States Patent
Fujimoto et al.

(10) Patent No.: US 11,515,442 B2
(45) Date of Patent: Nov. 29, 2022

(54) OPTICAL SEMICONDUCTOR ELEMENT

(71) Applicant: Murata Manufacturing Co., Ltd., Kyoto-fu (JP)

(72) Inventors: Kenji Fujimoto, Nagaokakyo (JP); Koshi Himeda, Nagaokakyo (JP); Toshihiro Tada, Nagaokakyo (JP); Tetsuro Toritsuka, Nagaokakyo (JP); Shinji Kaburaki, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 17/062,461

(22) Filed: Oct. 2, 2020

(65) Prior Publication Data

US 2021/0036176 A1 Feb. 4, 2021

Related U.S. Application Data

(63) Continuation of application No. PCT/JP2019/008321, filed on Mar. 4, 2019.

(30) Foreign Application Priority Data

Apr. 6, 2018 (JP) .............................. JP2018-074247

(51) Int. Cl.
*H01L 31/10* (2006.01)
*H01S 5/042* (2006.01)
(Continued)

(52) U.S. Cl.
CPC .............. *H01L 31/10* (2013.01); *H01S 5/028* (2013.01); *H01S 5/04254* (2019.08); *H01S 5/2275* (2013.01)

(58) Field of Classification Search
CPC ............... H01L 31/10; H01L 31/02161; H01L 31/022408; H01L 31/035281;
(Continued)

(56) References Cited

U.S. PATENT DOCUMENTS 6,753,214 B1 * 6/2004 Brinkmann ........... H01L 31/105
257/43
2009/0242934 A1 * 10/2009 Hu ....................... H01L 31/1844
257/E31.127
(Continued)

FOREIGN PATENT DOCUMENTS

JP H06-013644 A 1/1994
JP 2001-298211 A 10/2001
(Continued)

OTHER PUBLICATIONS

International Search Report issued in PCT/JP2019/008321; dated May 28, 2019.
(Continued)

*Primary Examiner* — Sitaramarao S Yechuri
(74) *Attorney, Agent, or Firm* — Studebaker & Brackett PC

(57) ABSTRACT

An optical semiconductor element having a mesa portion includes a substrate and semiconductor layers on the substrate. The optical semiconductor element further includes a first contact electrode, a second contact electrode on the semiconductor layer, first and second lead-out wires connected to the first and second contact electrodes, respectively, and an insulating film covering at least an upper surface of the semiconductor layer and the second contact electrode. The second lead-out wire is connected to the second contact electrode in an opening of the insulating film. An outer peripheral end of the second contact electrode in at least a portion where the second contact electrode and the second lead-out wire are connected is above and outside an outer peripheral end of a connection portion with the semiconductor layer, and an inner peripheral end is above and inside an inner peripheral end of the connection portion with the semiconductor layer.

20 Claims, 22 Drawing Sheets

(51) Int. Cl.
*H01S 5/028* (2006.01)
*H01S 5/227* (2006.01)

(58) Field of Classification Search
CPC ........... H01L 31/105; H01L 31/022416; H01S 5/028; H01S 5/04254; H01S 5/2275
See application file for complete search history.

(56) References Cited

U.S. PATENT DOCUMENTS

| | | |
|---|---|---|
| 2010/0181651 A1 | 7/2010 | Pan et al. |
| 2016/0043299 A1* | 2/2016 | Fujimori ................ B41J 2/1628 29/25.35 |
| 2017/0070026 A1 | 3/2017 | Jogan et al. |

FOREIGN PATENT DOCUMENTS

| | | |
|---|---|---|
| JP | 2009-071216 A | 4/2009 |
| JP | 2012-253138 A | 12/2012 |
| WO | 2017/212888 A1 | 12/2017 |

OTHER PUBLICATIONS

International Preliminary Report On Patentability and Written Opinion issued in PCT/JP2019/008321; dated Oct. 6, 2020.

\* cited by examiner

OPTICAL SEMICONDUCTOR ELEMENT

CROSS-REFERENCE TO RELATED APPLICATIONS

This application claims benefit of priority to International Patent Application No. PCT/JP2019/008321, filed Mar. 4, 2019, and to Japanese Patent Application No. 2018-074247, filed Apr. 6, 2018, the entire contents of each are incorporated herein by reference.

BACKGROUND

Technical Field

The present disclosure relates to an optical semiconductor element, and particularly, to an optical semiconductor element having a mesa portion.

Background Art

An optical semiconductor element having a mesa-shaped light-receiving portion has been known. As one of such optical semiconductor elements, Japanese Unexamined Patent Application Publication No. 2012-253138 describes an optical semiconductor element having a structure in which an entire surface of a mesa portion is covered with an insulating film having a cavity, and a P-type electrode and an N-type electrode are disposed in the cavity.

SUMMARY

However, in the optical semiconductor element described in Japanese Unexamined Patent Application Publication No. 2012-253138, there is a problem that moisture easily enters an inside of a semiconductor layer from a gap between the P-type electrode and the insulating film and from a gap between the N-type electrode and the insulating film.

Accordingly, the present disclosure provides an optical semiconductor element that can suppress entrance of moisture from an interface between an electrode and an insulating film.

An optical semiconductor element according to the present disclosure is an optical semiconductor element having a mesa portion provided with a light-transmitting surface that includes a substrate, a semiconductor layer provided on the substrate and forming a mesa portion, a first contact electrode provided in contact with the semiconductor layer, a second contact electrode provided on the semiconductor layer so as to surround the light-transmitting surface, a first lead-out wire connected to the first contact electrode, a second lead-out wire connected to an upper surface of the second contact electrode, and an insulating film provided so as to cover at least an upper surface of the semiconductor layer and the second contact electrode. An opening is included in the insulating film on the upper surface of the second contact electrode, and the second contact electrode and the second lead-out wire are connected to each other in the opening. Also, an outer peripheral end of the second contact electrode in at least a portion where the second contact electrode and the second lead-out wire are connected to each other is located above and outside an outer peripheral end of a connection portion between the second contact electrode and the semiconductor layer, and an inner peripheral end of the second contact electrode is located above and inside an inner peripheral end of the connection portion between the second contact electrode and the semiconductor layer.

The second contact electrode has a periphery of an annular shape and surrounds the light-transmitting surface in plan view, and a configuration may be adopted in which in all portions of the periphery, the outer peripheral end of the second contact electrode may be located above and outside the outer peripheral end of the connection portion between the second contact electrode and the semiconductor layer, and the inner peripheral end of the second contact electrode may be located above and inside the inner peripheral end of the connection portion between the second contact electrode and the semiconductor layer.

An outer peripheral end of the mesa portion may be located outside the outer peripheral end of the second contact electrode.

The second contact electrode may be configured to include a contact metal layer in contact with the semiconductor layer, a barrier metal layer provided on the contact metal layer, and a low-resistance metal layer provided on the barrier metal layer and having resistance lower than resistance of the contact metal layer and the barrier metal layer.

The contact metal layer may be made of one of Ti and Cr, the barrier metal layer may be made of Pt, and the low-resistance metal layer may be made of Au.

A sectional shape of the second contact electrode may be asymmetric when the mesa portion is cut in a vertical direction by a cutting line passing through a center of the light-transmitting surface.

The second contact electrode may have a periphery of an annular shape and surround the light-transmitting surface in plan view, and may have a structure in which a part of the periphery is disconnected.

A distance from the center of the light-transmitting surface to the outer peripheral end of the mesa portion may be long at, compared to a position at which the part of the periphery is disconnected, another position.

The insulating film may be made of $SiN_x$.

In addition, the insulating film may have a structure in which a $SiN_x$ layer and a $SiO_2$ layer are laminated.

A refractive index of the insulating film may be equal to or larger than 1.1 and equal to or smaller than 2.1 (i.e., from 1.1 to 2.1).

The mesa portion may be configured to have a laminated structure of a GaAs layer and an AlGaAs layer.

A slope portion is further included under the second lead-out wire, and an apex of the slope portion may be located at a position higher than an upper end of the second contact electrode.

An angle between an inclined portion up to the apex of the slope portion and a planar portion on the substrate may be equal to or smaller than 65°.

The insulating film may be provided so as to cover a side surface of the semiconductor layer as well, and a thickness of a portion of the insulating film covering the side surface of the semiconductor layer may be larger than a thickness of a portion of the insulating film covering the upper surface of the semiconductor layer.

A thickness of a portion of the insulating film covering the second contact electrode may be larger than the thickness of the portion of the insulating film covering the upper surface of the semiconductor layer.

The optical semiconductor element according to the present disclosure is configured such that an opening is provided in an insulating film on an upper surface of a second contact electrode, the second contact electrode and a second lead-out wire are connected to each other in the opening, an outer peripheral end of the second contact electrode is located above and outside an outer peripheral end of a connection portion between the second contact electrode and the second lead-out wire, and an inner peripheral end of the second contact electrode is located above and inside an inner peripheral end of a connecting portion between the second contact electrode and the second lead-out wire. With such a configuration, a path when moisture enters into a semiconductor layer through an interface between the insulating film and the second contact electrode lengthens, and thus it is possible to suppress the entrance of moisture into the semiconductor layer.

BRIEF DESCRIPTION OF THE DRAWINGS

FIG. 18B is a sectional view;

DETAILED DESCRIPTION

Hereinafter, embodiments of the present disclosure will be described in detail to specifically describe features of the present disclosure. In the following description, descriptions will be given by using an example in which an optical semiconductor element is a semiconductor light-receiving element.

First Embodiment

Figure 1:
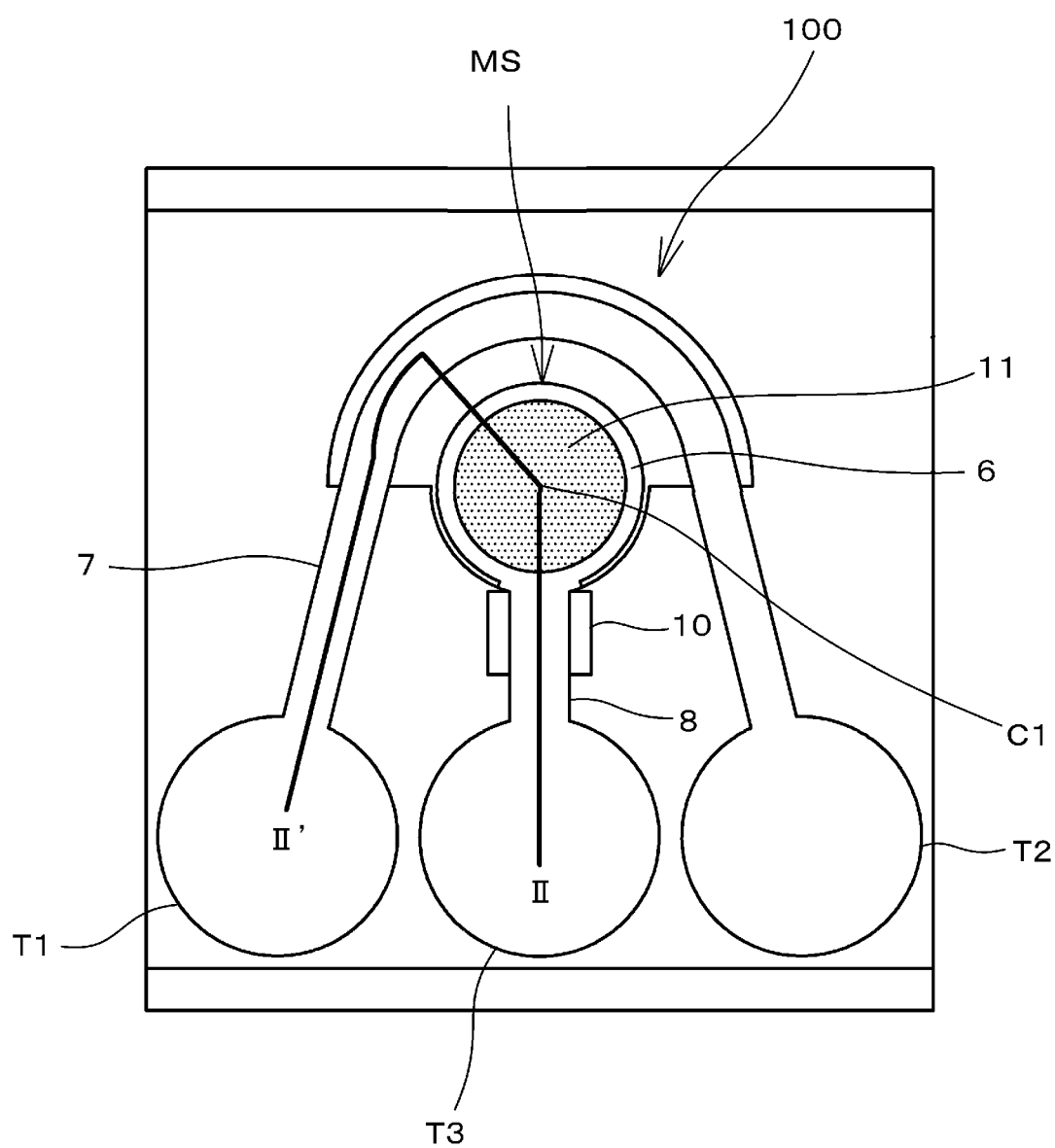
FIG. 1 is a plan view illustrating an optical semiconductor element in a first embodiment.
Figure 2:
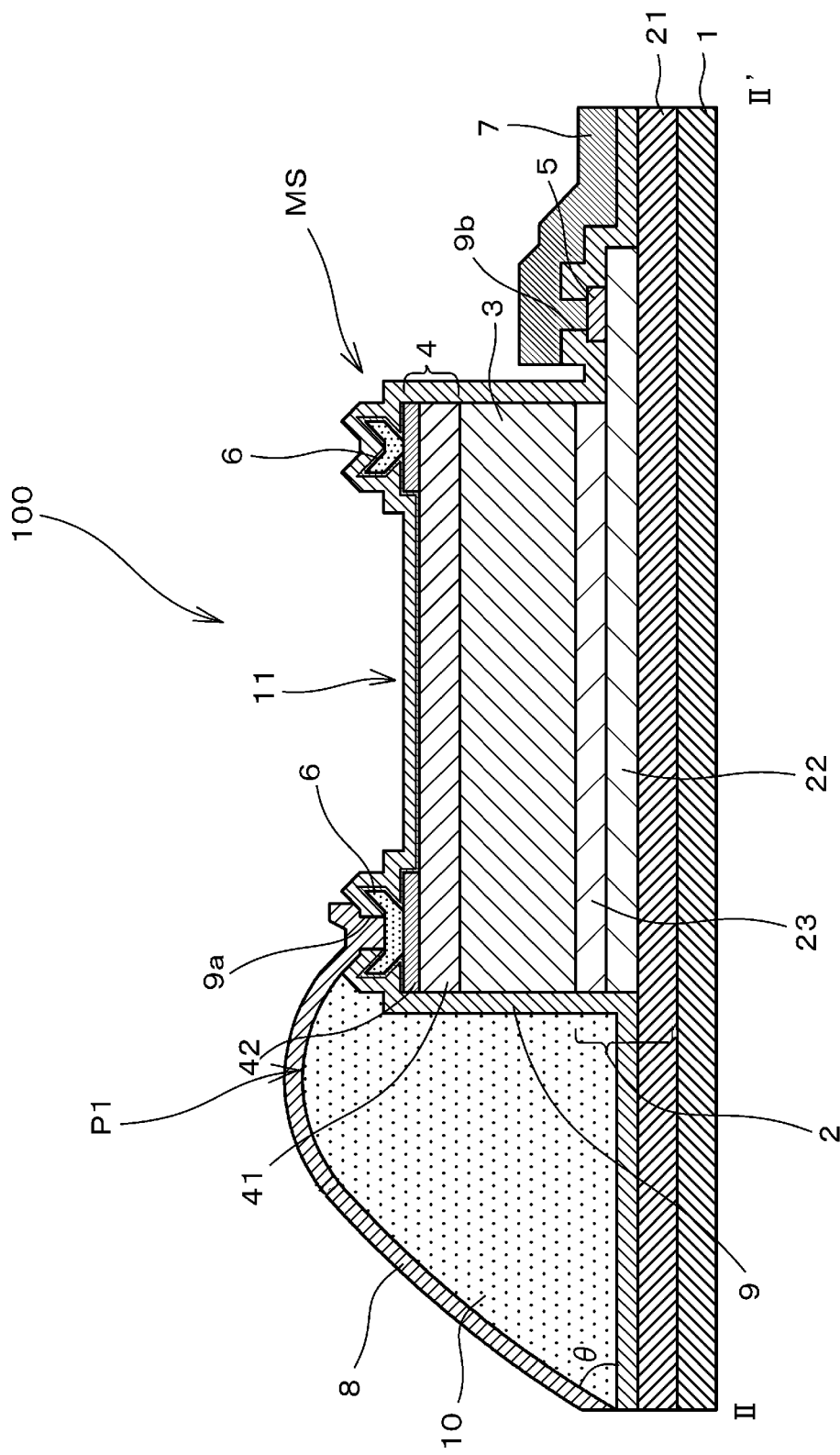
FIG. 2 is a sectional view when the optical semiconductor element illustrated in FIG. 1 is cut by a line II-II'.

FIG. 1 is a plan view illustrating an optical semiconductor element 100 in a first embodiment. FIG. 2 is a sectional view when the optical semiconductor element 100 illustrated in FIG. 1 is cut by a line II-II'. Note that, in FIG. 1 and FIG. 2, a thickness of each layer and a size of each portion in the figure are not proportional to a thickness of each layer and a size of each portion in an actual device, for ease of illustration.

Referring to FIG. 2, the optical semiconductor element 100 includes a semiconductor substrate 1, a first semiconductor layer 2 of a first conductivity type, a light-receiving layer 3, a second semiconductor layer 4 of a second conductivity type, a first contact electrode 5, a second contact electrode 6, a first lead-out wire 7, a second lead-out wire 8, an insulating film 9, and a slope portion 10. A semiconductor layer including the first semiconductor layer 2, the light-receiving layer 3, and the second semiconductor layer 4 forms a mesa portion MS having a light-receiving surface 11 that is a light-transmitting surface.

As the semiconductor substrate 1, for example, a GaAs substrate or an InP substrate can be used.

The first semiconductor layer 2 is provided on the semiconductor substrate 1. In the present embodiment, the first conductivity type is an N-type, and the first semiconductor layer 2 is an N-type semiconductor layer. The first semiconductor layer 2 may be made of, for example, an $In_x(Ga_yAl_{(1-y)})_{(1-x)}As$ or $In_xGa_{(1-x)}As_zP_{(1-z)}$ based material. However, for x, y, and z, relationships of $0 \leq x \leq 1$, $0 \leq y \leq 1$, and $0 \leq z \leq 1$ hold.

The first semiconductor layer 2 includes a buffer layer 21, a first contact layer 22, and a first cladding layer 23. The buffer layer 21 is provided on the semiconductor substrate 1. The first contact layer 22 is provided on the buffer layer 21. In addition, the first cladding layer 23 is provided on the first contact layer 22.

The buffer layer 21 and the first contact layer 22 are made of, for example, GaAs. Further, the first cladding layer 23 is made of, for example, AlGaAs. In order to provide N-type conductivity, the buffer layer 21, the first contact layer 22, and the first cladding layer 23 are doped with, for example, Si (silicon).

The light-receiving layer 3 is an intrinsic semiconductor layer that does not contain an impurity, and is provided on the first semiconductor layer 2. The light-receiving layer 3 is made of, for example, an $In_x(Ga_yAl_{(1-y)})_{(1-x)}As$ or $In_xGa_{(1-x)}As_zP_{(1-z)}$ based material.

The second semiconductor layer 4 is provided on the light-receiving layer 3. In the present embodiment, the second conductivity type is a P-type, and the second semiconductor layer 4 is a P-type semiconductor layer. The second semiconductor layer 4 is made of, for example, an $In_x(Ga_yAl_{(1-y)})_{(1-x)}As$ or $In_xGa_{(1-x)}As_zP_{(1-z)}$ based material.

The second semiconductor layer 4 includes a second cladding layer 41 and a second contact layer 42. The second cladding layer 41 is provided on the light-receiving layer 3. Further, the second contact layer 42 is provided in a partial region on the second cladding layer 41.

The second cladding layer 41 is made of, for example, GaAlAs. Further, the second contact layer 42 is made of, for example, GaAs. In order to provide P-type conductivity, the second cladding layer 41 and the second contact layer 42 are doped with, for example, C (carbon).

The first contact electrode 5 is provided on the first contact layer 22.

The second contact electrode 6 is provided on the second contact layer 42. As illustrated in FIG. 1, the second contact electrode 6 has a substantially annular shape in plan view and is provided so as to surround the light-receiving surface 11. Note that, surrounding the light-receiving surface 11 includes not only a shape in which the second contact electrode 6 completely surrounds the light-receiving surface 11, but also a shape in which the second contact electrode 6 is located around the light-receiving surface 11 and partially surrounds the light-receiving surface 11.

Figure 3:
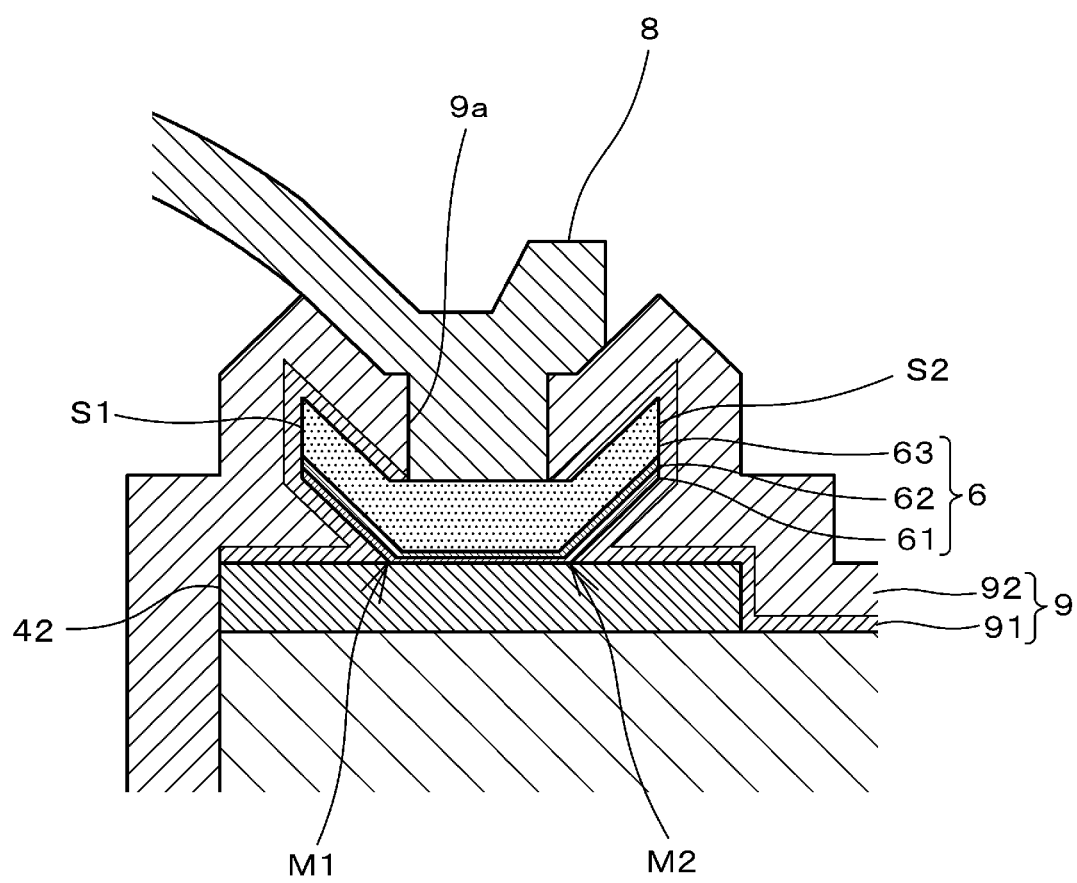
FIG. 3 is an enlarged sectional view at a position where a second contact electrode and a second lead-out wire are connected to each other.

FIG. 3 is an enlarged sectional view at a position where the second contact electrode 6 and the second lead-out wire 8 are connected to each other. As illustrated in FIG. 3, the second contact electrode 6 has a structure in which a contact metal layer 61, a barrier metal layer 62, and a low-resistance metal layer 63 are laminated in this order from a side of the second contact layer 42.

The contact metal layer 61 is a layer that forms an ohmic contact with the second contact layer 42, and is made of, for example, one of Ti and Cr. By providing the contact metal layer 61 on the second contact layer 42, it is possible to form the ohmic contact with the second contact layer 42.

The barrier metal layer 62 is a layer for suppressing diffusion of metal forming the low-resistance metal layer 63 to the second contact layer 42, and is made of, for example, Pt. Since the second contact electrode 6 includes the barrier metal layer 62, it is possible to suppress the diffusion of the metal forming the low-resistance metal layer 63 to the second contact layer 42.

The low-resistance metal layer 63 is a layer for lowering resistance of an entirety of the second contact electrode 6, and is made of metal, such as Au, having resistance lower than that of the contact metal layer 61 and the barrier metal layer 62. Since the second contact electrode 6 includes the low-resistance metal layer 63, the resistance of the entirety of second contact electrode 6 can be lowered.

As described above, by forming the contact metal layer 61 by one of Ti and Cr, the barrier metal layer 62 by Pt, and the low-resistance metal layer 63 by Au, the second contact electrode 6 can be made to be a non-alloy ohmic contact electrode. Compared to a case where the contact metal layer 61 is made to be an alloy ohmic contact electrode, since an alloy layer is not present, the contact metal layer 61 is excellent in reliability and advantageous in terms of processing.

As illustrated in FIG. 3, an outer peripheral end S1 of the second contact electrode 6 in at least a portion where the second contact electrode 6 and the second lead-out wire 8 are connected to each other is located above and outside an outer peripheral end M1 of a connection portion (junction surface) between the second contact electrode 6 and the second contact layer 42. Further, an inner peripheral end S2 of the second contact electrode 6 in at least the portion where the second contact electrode 6 and the second lead-out wire 8 are connected to each other is located above and inside an inner peripheral end M2 of the connection portion between the second contact electrode 6 and the second contact layer 42. Note that, as described above, the second contact electrode 6 has the substantially annular shape in plan view, and "outside" and "inside" mean "radially outside" that is a side away from the light-receiving surface 11 and "radially inside" that is a side close to the light-receiving surface 11, respectively. Further, "above" refers to a direction when the light-receiving surface 11 is located above the semiconductor substrate 1, and when there is not such a positional relationship, the direction refers to a direction in which the light-receiving surface 11 is located with respect to the semiconductor substrate 1.

In the present embodiment, the second contact electrode 6 has the periphery of an annular shape and surrounds the light-receiving surface 11 in plan view, specifically, the substantially annular shape, and in all portions of the periphery, the outer peripheral end S1 of the second contact electrode 6 is located above and outside the outer peripheral end M1 of the connection portion (junction surface) between the second contact electrode 6 and the second contact layer 42. In addition, in all the portions of the periphery, the inner peripheral end S2 of the second contact electrode 6 is located above and inside the inner peripheral end M2 of the connection portion between the second contact electrode 6 and the second contact layer 42.

However, the positional relationship between the outer peripheral end Si of the second contact electrode 6 and the outer peripheral end M1 of the connection portion and the positional relationship between the inner peripheral end S2 of the second contact electrode 6 and the inner peripheral end M2 of the connection portion described above are not required to be satisfied in all of the portions of the periphery, and it is sufficient that the above-described relationships are satisfied in at least the portion where the second contact electrode 6 and the second lead-out wire 8 are connected to each other.

The outer peripheral end S1 and the inner peripheral end S2 of the second contact electrode 6 are located above the connection portion between the second contact electrode 6 and the second contact layer 42, and thus it is possible to increase a distance between the low-resistance metal layer 63 and the second contact layer 42 in the outer peripheral end S1 and the inner peripheral end S2 of the second contact electrode 6. Accordingly, it is possible to suppress the contact of the low-resistance metal layer 63 with the second contact layer 42, and thus it is possible to suppress the diffusion of the metal contained in the low-resistance metal layer 63 into the second contact layer 42, thereby suppressing deterioration in diode characteristics.

In addition, the present embodiment is configured such that the second contact layer 42 and a third external connection terminal T3 (see FIG. 1) are connected to each other not with an integrally formed electrode but via the second contact electrode 6 and the second lead-out wire 8 that are separately configured. That is, by reducing the second contact electrode 6 in size, an area of the mesa portion MS can be reduced in plan view, and junction capacitance can be reduced.

Figure 4A:
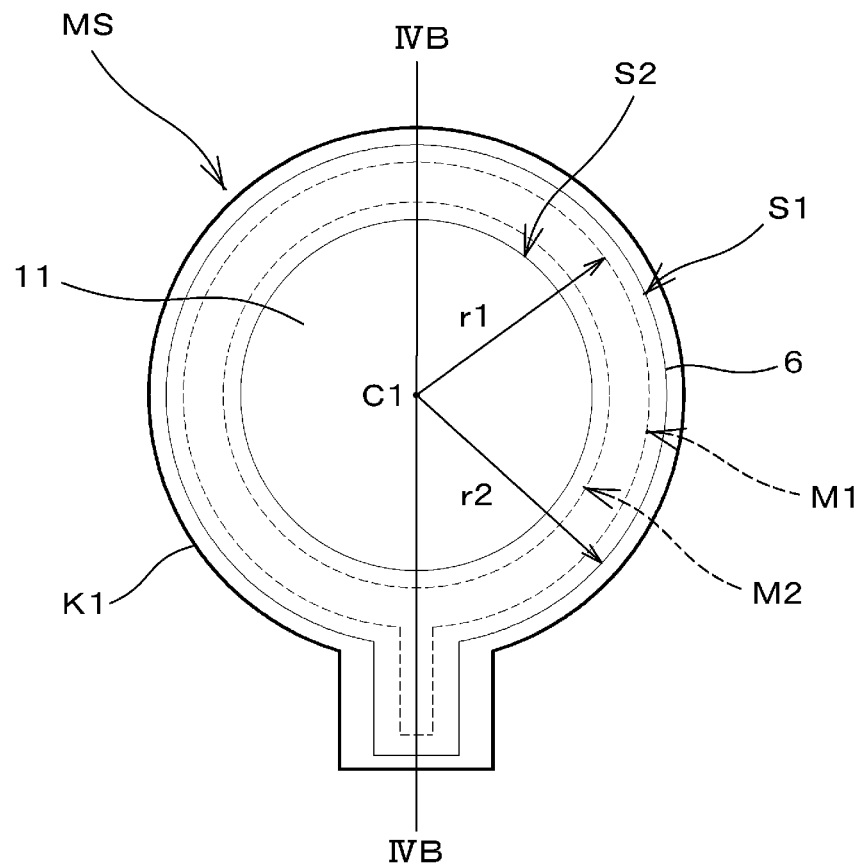
FIG. 4A is a plan view of a mesa portion.
Figure 4B:
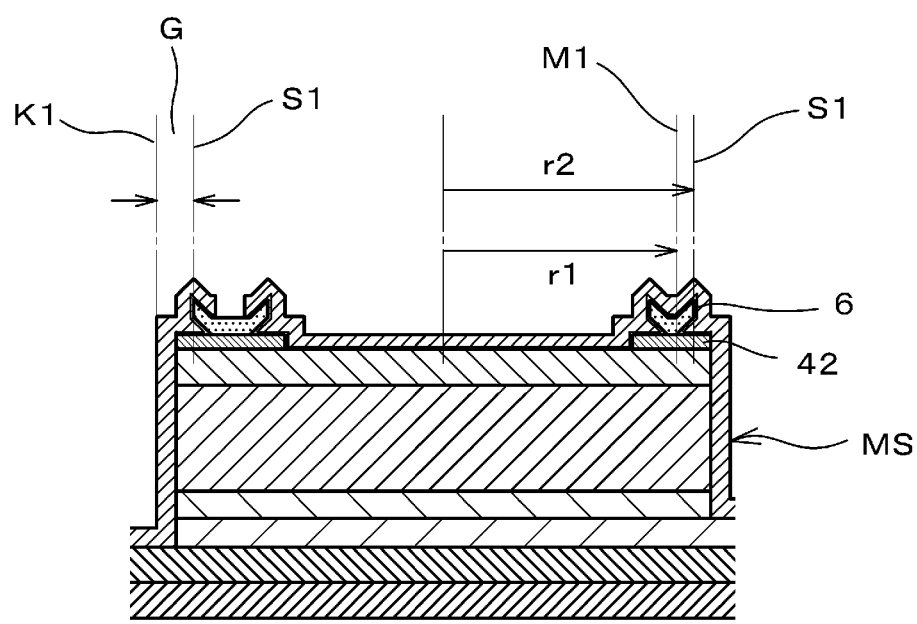
FIG. 4B is a sectional view when the mesa portion illustrated in FIG. 4A is cut by a line IVB-IVB.

FIG. 4A is a plan view of the mesa portion MS. Additionally, FIG. 4B is a sectional view when the mesa portion MS illustrated in FIG. 4A is cut by a line IVB-IVB. The mesa portion MS has a columnar shape. However, the shape of the mesa portion MS is not limited to the columnar shape. Further, in plan view, an outer peripheral end of the mesa portion MS and the outer peripheral end S1 of the second contact electrode 6 have a substantially concentric relationship.

As described above, the mesa portion MS may be configured to have the laminated structure of a GaAs layer and an AlGaAs layer. In such a configuration, since a cutoff frequency can be increased, when the optical semiconductor element 100 in the present embodiment is used for, for example, an optical communication system, it is possible to perform high-speed transmission with a high cutoff frequency.

As illustrated in FIGS. 4A and 4B, a distance r1 from a center C1 of the light-receiving surface 11 to the outer peripheral end M1 of the connection portion between the second contact electrode 6 and the second contact layer 42 is shorter than a distance r2 from the center C1 of the light-receiving surface 11 to the outer peripheral end S1 of the second contact electrode 6. With such a configuration, the outer peripheral end of the mesa portion MS can be brought close to the outer peripheral end M1 of the connection portion between the second contact electrode 6 and the second contact layer 42, thus, it is possible to reduce the area of the mesa portion MS in plan view, and the junction capacitance can be reduced.

In addition, in plan view, an area of the second contact electrode 6 is larger than an area of the connection portion between the second contact electrode 6 and the second contact layer 42. With such a configuration, it is possible to suppress deterioration in signal quality due to an increase in wiring resistance, while reducing the second contact electrode 6 in size.

An outer peripheral end K1 of the mesa portion MS is located outside the outer peripheral end S1 of the second contact electrode 6. That is, a gap G exists between the outer peripheral end S1 of the second contact electrode 6 and the outer peripheral end K1 of the mesa portion MS (see FIG. 4B). The gap G is, for example, equal to or larger than 0.1 µm and equal to or smaller than 2.0 µm (i.e., from 0.1 µm to 2.0 µm). Since the gap G is present, a configuration can be adopted in which the outer peripheral end S1 of the second contact electrode 6 is covered with the insulating film 9. Further, by setting the gap G to be equal to or larger than 0.1 µm, the insulating film 9 can be formed between the outer peripheral end M1 of the connection portion between the second contact electrode 6 and the second contact layer 42 and the outer peripheral end K1 of the mesa portion MS, and moisture resistance can be improved. Further, by setting the gap G to be equal to or smaller than 2.0 µm, it is possible to set a decrease in a band along with an increase in junction capacitance to be equal to or smaller than 1 GHz.

The insulating film 9 is provided so as to cover at least an upper surface of the second semiconductor layer 4 and the second contact electrode 6. In the present embodiment, the insulating film 9 is provided so as to cover an entire surface of the optical semiconductor element 100. However, the insulating film 9 does not need to cover the entire surface of the optical semiconductor element 100, and may be provided only in a necessary portion.

An opening 9a is included in the insulating film 9, on an upper surface of the second contact electrode 6 (see FIG. 3). In the opening 9a of the insulating film 9, the second lead-out wire 8 and the second contact electrode 6 are connected to each other.

As described above, in the present embodiment, the second contact electrode 6 and the second lead-out wire 8 are configured separately, and in the opening 9a of the insulating film 9, the second lead-out wire 8 and the second contact electrode 6 are connected to each other. That is, as illustrated in FIG. 3, the outer peripheral end S1 and the inner peripheral end S2 of the second contact electrode 6 are covered with the insulating film 9.

Further, the outer peripheral end S1 of the second contact electrode 6 is located above and outside the outer peripheral end M1 of the connection portion between the second contact electrode 6 and the second contact layer 42. Further, the inner peripheral end S2 of the second contact electrode 6 is located above and inside the inner peripheral end M2 of the connection portion between the second contact electrode 6 and the second contact layer 42.

In the optical semiconductor element 100 in the present embodiment, by providing the above-described configuration, compared to an optical semiconductor element in the past in which an end portion of a second contact electrode coincides with an end portion of a connection portion between the second contact electrode and a second contact layer, a path when moisture enters the semiconductor layer through an interface between the insulating film 9 and the second contact electrode 6 lengthens. Thus, in the optical semiconductor element 100 in the present embodiment, it is possible to suppress the entrance of moisture into the semiconductor layer, and to improve moisture resistance reliability.

Further, an opening 9b is included in the insulating film 9, on the first contact electrode 5 (see FIG. 2). In the opening 9b in the insulating film 9, the first lead-out wire 7 and the first contact electrode 5 are connected to each other.

The insulating film 9 functions as a protective film, and functions as an antireflective film for suppressing reflection on the light-receiving surface 11. A refractive index of the insulating film 9 is, for example, equal to or larger than 1.1 and equal to or smaller than 2.1 (i.e., from 1.1 to 2.1). By setting the refractive index of the insulating film 9 to be equal to or larger than 1.1 and equal to or smaller than 2.1 (i.e., from 1.1 to 2.1), it is possible to effectively suppress reflection of the light-receiving surface 11.

In the present embodiment, the insulating film 9 is formed in a two-layer structure of a first insulating film 91 and a second insulating film 92 having respective refractive indices different from each other (see FIG. 3). The first insulating film 91 is formed on an upper surface of the mesa portion MS, and the second insulating film 92 is formed in a region in which the first insulating film 91 is formed, on the first insulating film 91, so as to substantially cover the entire surface of the optical semiconductor element 100.

For example, the first insulating film 91 is made of $SiN_x$, and the second insulating film 92 is made of $SiO_2$. By forming the insulating film 9 by two layers having respective refractive indices different from each other, for example, two layers of $SiN_x$ and $SiO_2$, it is possible to more effectively suppress the reflection of the light-receiving surface 11.

In the present embodiment, a thickness of a portion that covers a side surface of a semiconductor layer forming the mesa portion MS of the insulating film 9 is larger than a thickness of a portion covering an upper surface of the semiconductor layer. The upper surface of the semiconductor layer here is a portion from which a position where the second contact electrode 6 is provided is excluded, that corresponds to the light-receiving surface 11. With such a configuration, it is possible to more effectively suppress the entrance of moisture from the side surface of the semiconductor layer.

In addition, in the present embodiment, a thickness of a portion that covers the second contact electrode 6 of the insulating film 9 is larger than a thickness of the portion that covers the upper surface of the semiconductor layer. Again, the upper surface of the semiconductor layer is the portion from which the position where the second contact electrode 6 is provided is excluded, that corresponds to the light-receiving surface 11. With such a configuration, it is possible to suppress occurrence of a crack in the insulating film due to deterioration, and separation of the insulating film, at an interface of the second contact electrode 6, and to suppress the entrance of moisture.

Note that, the insulating film 9 may be formed of a single layer. In that case, the insulating film 9 may be made of, for example, $SiN_x$, $SiO_2$, SiON, or the like. By forming the insulating film 9 by $SiN_x$, $SiO_2$, or SiON, it is possible to ensure the moisture resistance, and suppress the reflection of the light-receiving surface 11.

The first lead-out wire 7 connects between the first contact electrode 5, and a first external connection terminal T1 and a second external connection terminal T2 that are provided on the semiconductor substrate 1.

The second lead-out wire 8 connects between the second contact electrode 6 and the third external connection terminal T3. Since the third external connection terminal T3 is located on the semiconductor substrate 1, and the second contact electrode 6 is located above the mesa portion MS, the second lead-out wire 8 is provided so as to be lifted upward the mesa portion MS from above the semiconductor substrate 1.

In the present embodiment, the slope portion 10 is provided under the second lead-out wire 8 (see FIG. 2). The slope portion 10 is provided to lift the second lead-out wire 8 upward from above the semiconductor substrate 1 at a gentle angle. The slope portion 10 is made of a material having an insulating property, for example, polyimide resin.

Table 1 shows a result obtained by simulation of whether or not a crack occurred in the second lead-out wire 8, when an angle θ between an inclined portion up to an apex P1 of the slope portion 10 and a planar portion of the semiconductor substrate 1 was changed. When the angle θ was each of 90°, 80°, and 70°, a crack occurred in the second lead-out wire 8 (NG). On the other hand, when the angle θ was each of 65°, 60°, 50°, 40°, and 35°, no crack occurred (OK).

TABLE 1

| Angle θ | 90° | 80° | 70° | 65° | 60° | 50° | 40° | 35° |
|---|---|---|---|---|---|---|---|---|
| Determination | NG | NG | NG | OK | OK | OK | OK | OK |

Here, when the above angle θ is made to be smaller than 35°, an area of the slope portion 10 widens in plan view, and it becomes difficult to reduce the optical semiconductor element 100 in size. Thus, it is preferable that the angle θ between the inclined portion up to the apex P1 of the slope portion 10 and the planar portion of the semiconductor substrate 1 be equal to or larger than 35° and equal to or smaller than 65° (i.e., from 35° to 65°). By setting the angle θ between the inclined portion up to the apex P1 of the slope portion 10 and the planar portion of the semiconductor substrate 1 to be equal to or larger than 35° and equal to or smaller than 65° (i.e., from 35° to 65°), it is possible to suppress an increase in size of the optical semiconductor element 100, and suppress occurrence of a crack in the second lead-out wire 8, thereby suppressing disconnection.

Further, since the second lead-out wire 8 is formed on the slope portion 10, it is possible to widen an interval between the second lead-out wire 8 and the semiconductor layer of the mesa portion MS. Accordingly, parasitic capacitance between the two can be reduced, and the cutoff frequency can be increased. Thus, when the optical semiconductor element 100 in the present embodiment is used for, for example, an optical communication system, it is possible to perform high-speed transmission with the high cutoff frequency.

As illustrated in FIG. 2, the apex P1 of the slope portion 10 is located at a higher position than an upper end of the second contact electrode 6. That is, the second lead-out wire 8 is connected to the upper surface of the second contact electrode 6 in so as to be lifted from above the semiconductor substrate 1 up to the apex P1 along the slope portion 10 and then to descend toward the second contact electrode 6. With such a configuration, it is possible to more effectively suppress disconnection of the second lead-out wire 8. Note that, the apex P1 of the slope portion 10 is at a position at which a height of the slope portion 10 with respect to the semiconductor substrate 1 is the highest, and is not limited to one position. Further, the upper end of the second contact electrode 6 is an end portion that is farther from the semiconductor substrate 1 with respect to the semiconductor substrate 1.

Figure 5:
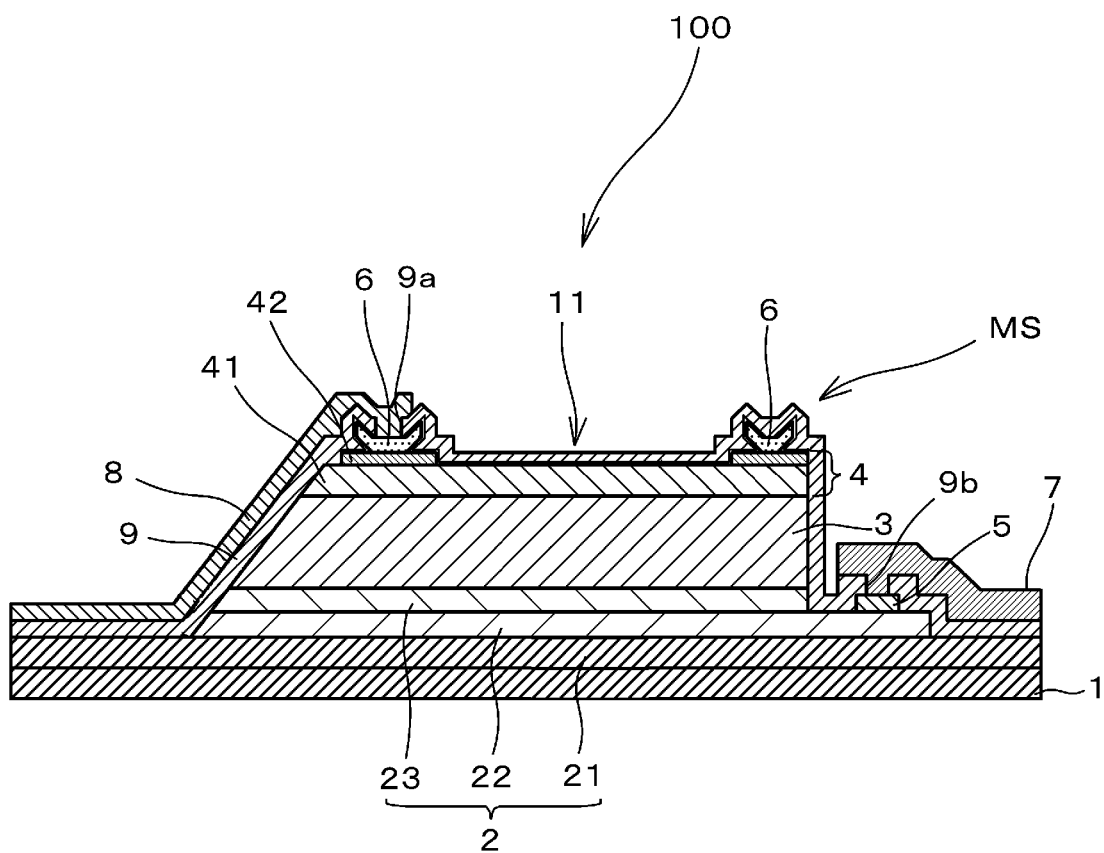
FIG. 5 is a sectional view of the mesa portion having a structure in which an end face is inclined.

Note that, instead of providing the slope portion 10, as illustrated in FIG. 5, an end face of the mesa portion MS may be inclined, and the second lead-out wire 8 may be provided along the inclined end face. The inclination of the end face can be formed, for example, by etching. Also, in this case, an angle of the inclination of the end face of the mesa portion MS is preferably equal to or smaller than 65°.

(Manufacturing Method for Optical Semiconductor Element)

Hereinafter, a manufacturing method for the optical semiconductor element 100 in the first embodiment will be described with reference to FIG. 6A to FIG. 16C. In each of FIG. 6A to FIG. 16C, a plan view is illustrated in the Figure "A", and a sectional view cut by a line B-B' is illustrated in the Figure "B".

Figure 6A:
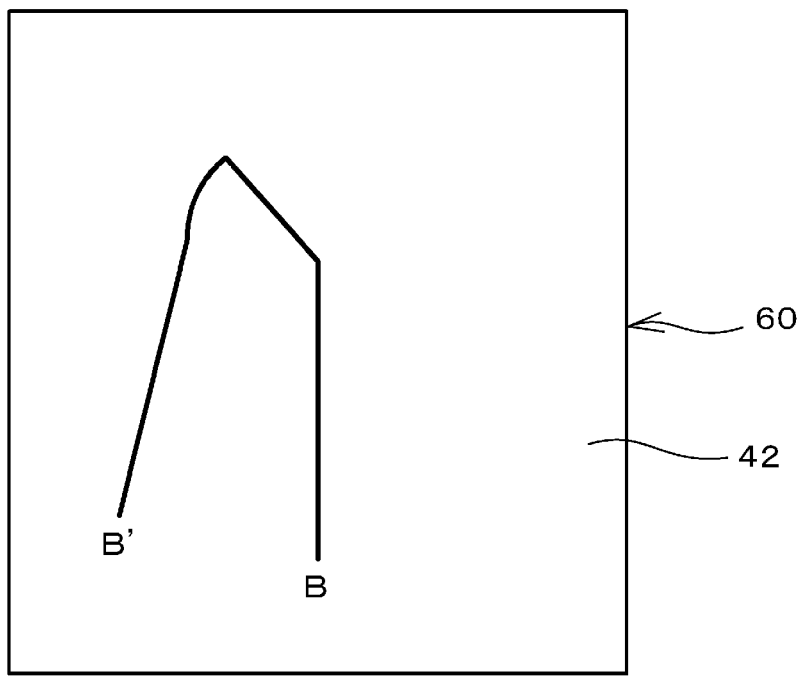
FIGS. 6A and 6B are diagrams for explaining a manufacturing method for the optical semiconductor element in the first embodiment.
Figure 6B:
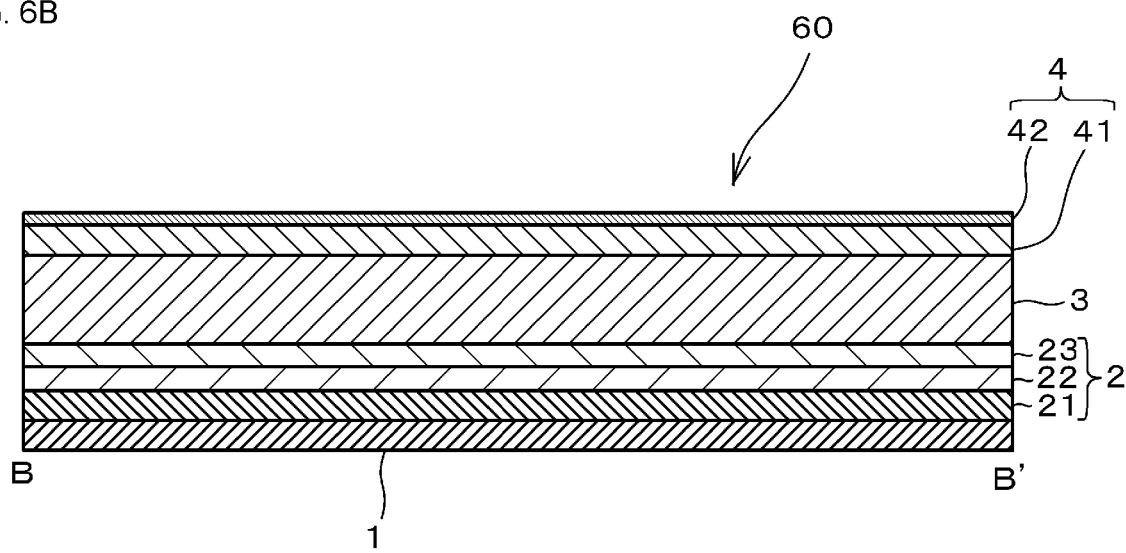

First, a laminated body 60 in which a first semiconductor layer, a light-receiving layer, and a second semiconductor layer are laminated is formed on the semiconductor substrate 1 (see FIGS. 6A and 6B). Note that, the first semiconductor layer, the light-receiving layer, and the second semiconductor layer that form the laminated body 60 are respective layers finally forming the first semiconductor layer 2, the light-receiving layer 3, and the second semiconductor layer 4 illustrated in FIG. 2, and in this stage, the layers are different in shape, but are denoted by the same reference numerals as in a final form for ease of understanding.

For the formation of the first semiconductor layer 2, the light-receiving layer 3, and the second semiconductor layer 4, for example, an epitaxial growth method such as an MOCVD (Metal Organic Chemical Vapor Deposition) method, an MBE (Molecular Beam Epitaxy) method, or the like is used.

Specifically, the buffer layer 21, the first contact layer 22, the first cladding layer 23, the light-receiving layer 3, the second cladding layer 41, and the second contact layer 42 are formed in order on the semiconductor substrate 1. The semiconductor substrate 1 is, for example, a GaAs substrate. The buffer layer 21, the first contact layer 22, the light-receiving layer 3, and the second contact layer 42 can be made of GaAs, for example. In addition, the first cladding layer 23 and the second cladding layer 41 may be made of AlGaAs, for example.

When the first semiconductor layer 2 is to be an N-type semiconductor layer, an N-type dopant such as Si is used for doping. In addition, when the second semiconductor layer 4 is to be a P-type semiconductor layer, a P-type dopant such as C is used for doping.

Figure 7A:
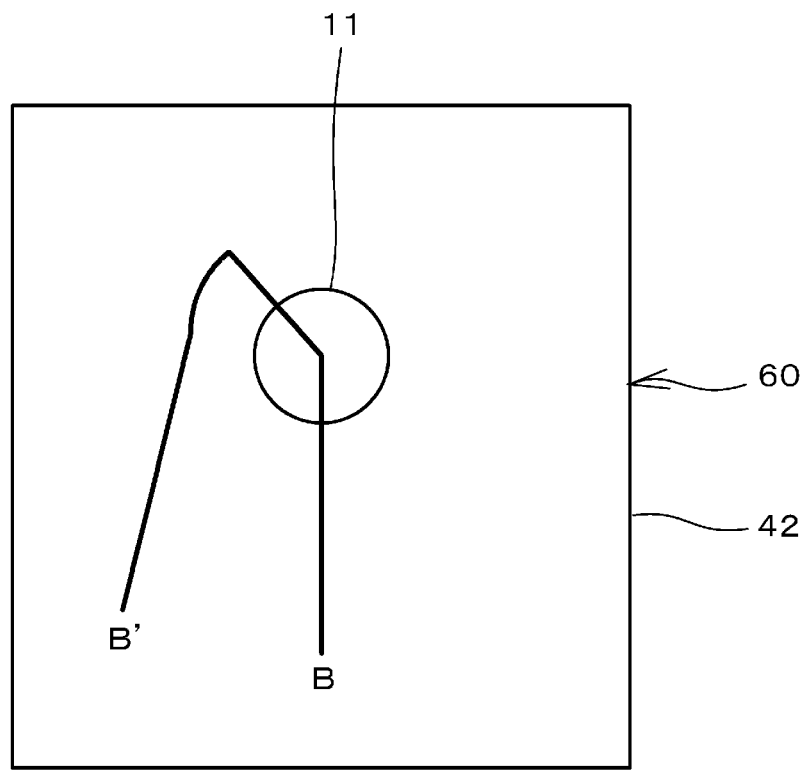
FIGS. 7A and 7B are diagrams following FIGS. 6A and 6B for explaining the manufacturing method for the optical semiconductor element in the first embodiment.
Figure 7B:
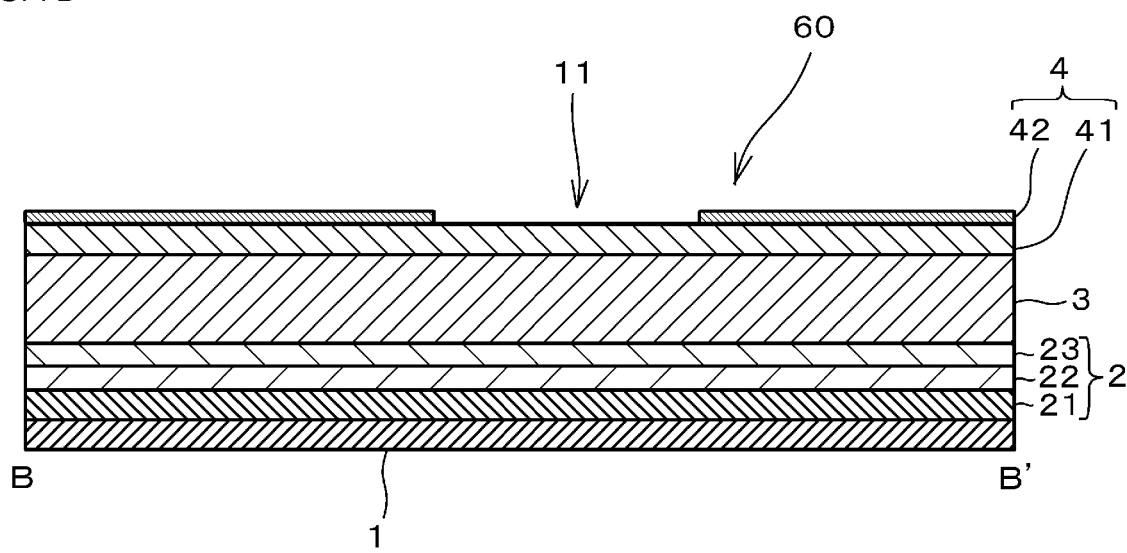

Next, in order to form the light-receiving surface 11, a predetermined region of the second contact layer 42 is etched (see FIGS. 7A and 7B). That is, since the second contact layer 42 has a structure that is unlikely to transmit light having a desired wavelength, the light-receiving surface 11 is formed by etching the predetermined region of the second contact layer 42. For the etching, dry etching methods such as RIE (reactive ion etching), ion milling and the like, or a wet etching method can be used.

Note that, when the second contact layer 42 is formed of a material that transmits light having the desired wavelength, the above-described etching is unnecessary.

Figure 8A:
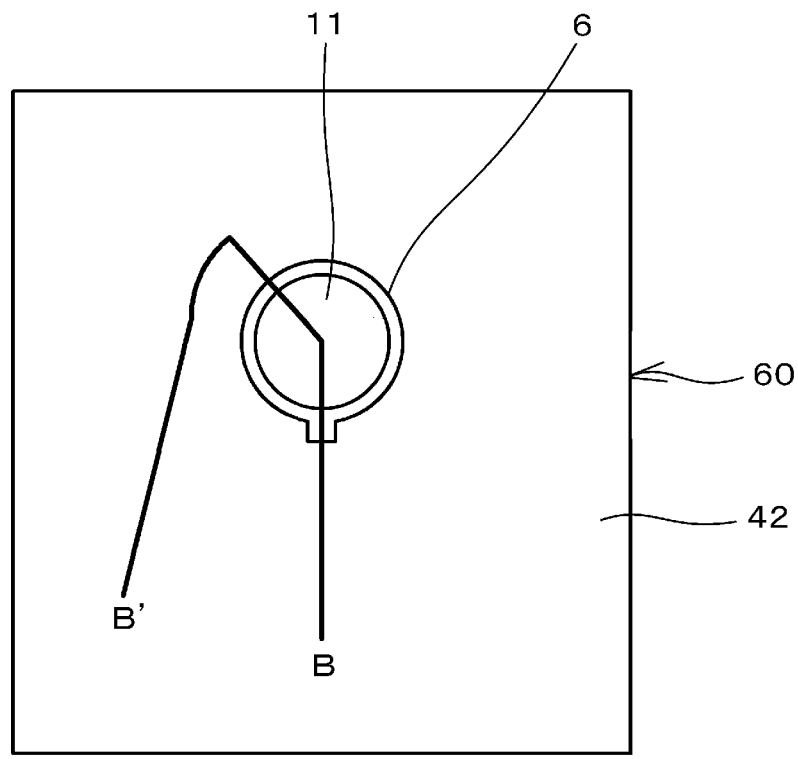
FIGS. 8A and 8B are diagrams following FIGS. 7A and 7B for explaining the manufacturing method for the optical semiconductor element in the first embodiment.
Figure 8B:
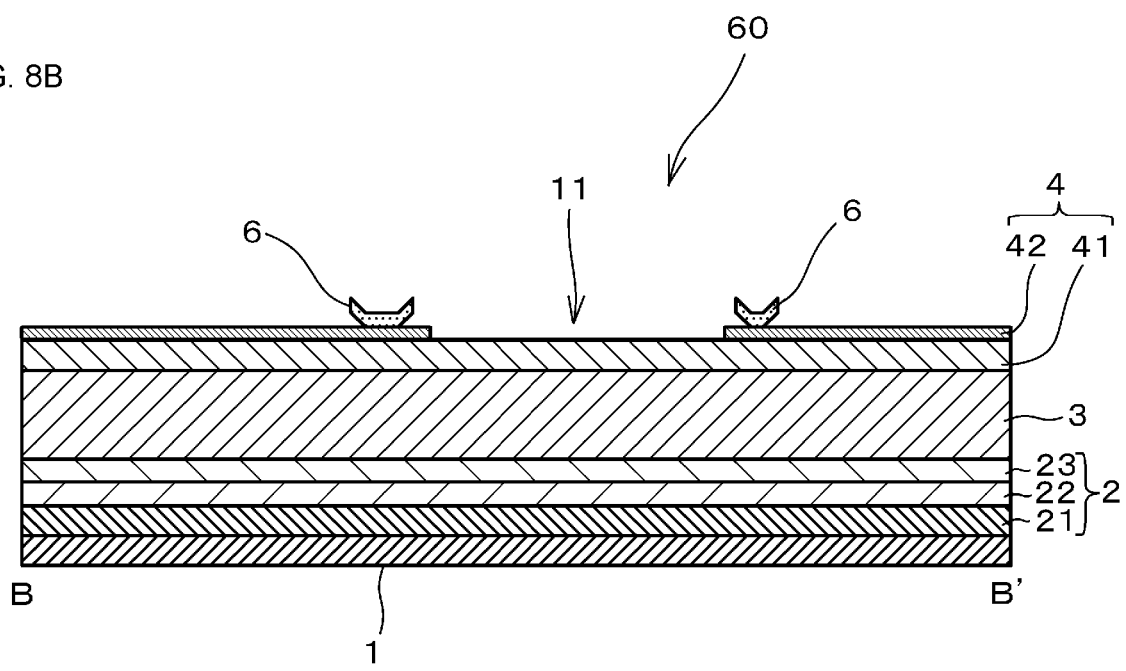

Subsequently, a second contact electrode 6 is formed on the second contact layer 42 (see FIGS. 8A and 8B). A forming for the second contact electrode 6 will be described with reference to FIGS. 16A to 16C.

Figure 16A:
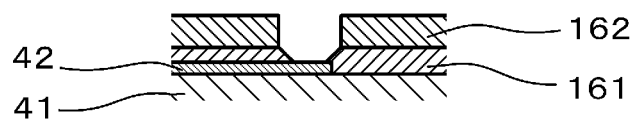
FIGS. 16A to 16C are diagrams for explaining a detailed forming method for the second contact electrode.

First, a first resist layer 161 is formed on the second cladding layer 41 and the second contact layer 42, then photolithography is performed, and a second resist layer 162 is formed on the first resist layer 161, and then the photolithography is performed again, to remove resist at a position where the second contact electrode 6 is to be formed, as illustrated in FIG. 16A.

Figure 16B:
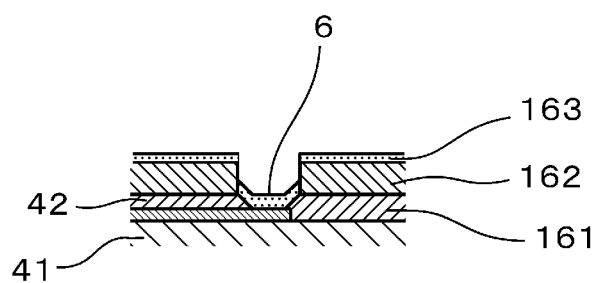
Figure 16C:
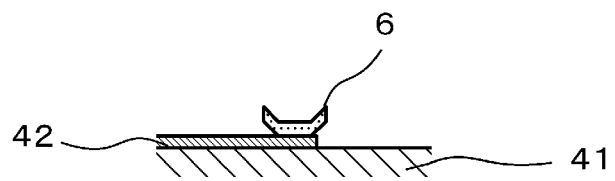

Subsequently, as illustrated in FIG. 16B, a thin film 163 for forming the second contact electrode 6 is formed. The thin film 163 is formed by, for example, vapor deposition. Here, the thin film 163 having a three-layer structure in which Ti, Pt, and Au are laminated in order from a bottom is formed. The Ti layer, the Pt layer, and the Au layer form the contact metal layer 61, the barrier metal layer 62, and the low-resistance metal layer 63 illustrated in FIG. 3, respectively, when the second contact electrode 6 is completed.

Finally, the first resist layer 161, the second resist layer 162, and the thin film 163 formed on the second resist layer 162 are removed.

Through the above-described processes, the second contact electrode 6 is formed.

Figure 9A:
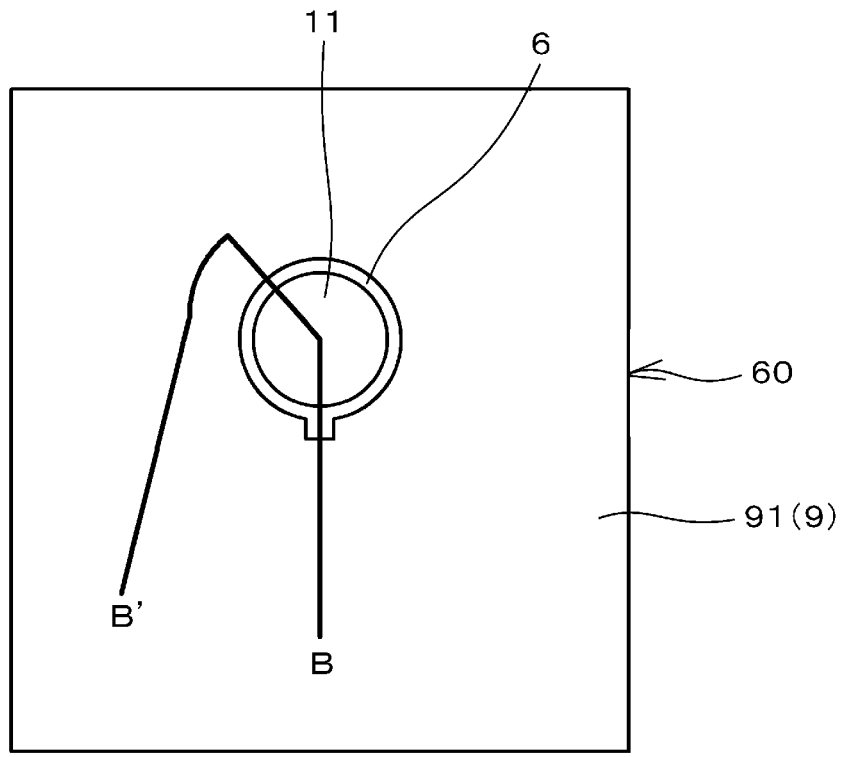
FIGS. 9A and 9B are diagrams following FIGS. 8A and 8B for explaining the manufacturing method for the optical semiconductor element in the first embodiment.
Figure 9B:
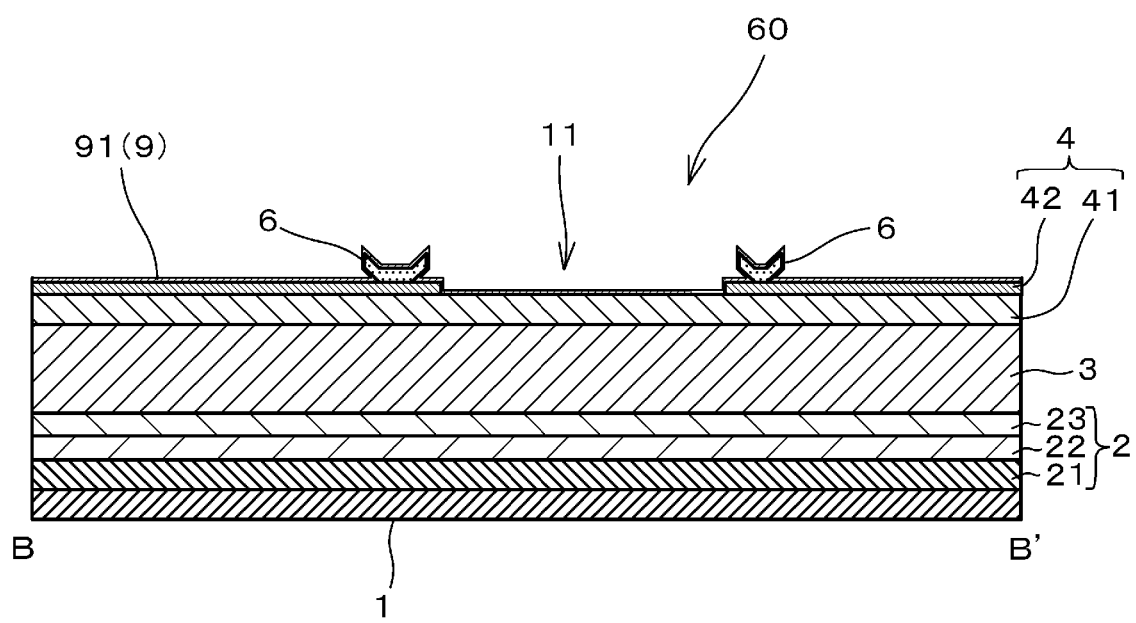

Subsequently, as illustrated in FIGS. 9A and 9B, the first insulating film 91 is formed so as to cover an entire surface of the laminated body 60 and the second contact electrode 6. The first insulating film 91 is made of, for example, $SiN_x$. However, the first insulating film 91 may be made of $SiO_2$, SiON, or the like. When the first insulating film is made of $SiN_x$ or SiON, the first insulating film can be formed by, for example, a plasma CVD method. In addition, when the first insulating film is made of $SiO_2$, for example, the first insulating film can be formed by a sputtering method or a thermal CVD method.

Figure 10A:
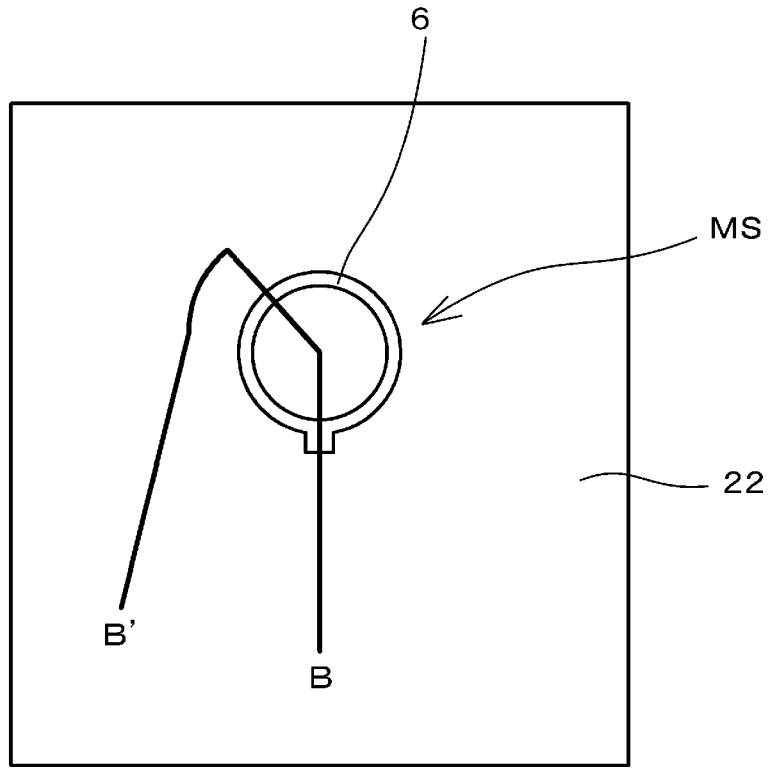
FIGS. 10A and 10B are diagrams following FIGS. 9A and 9B for explaining the manufacturing method for the optical semiconductor element in the first embodiment.
Figure 10B:
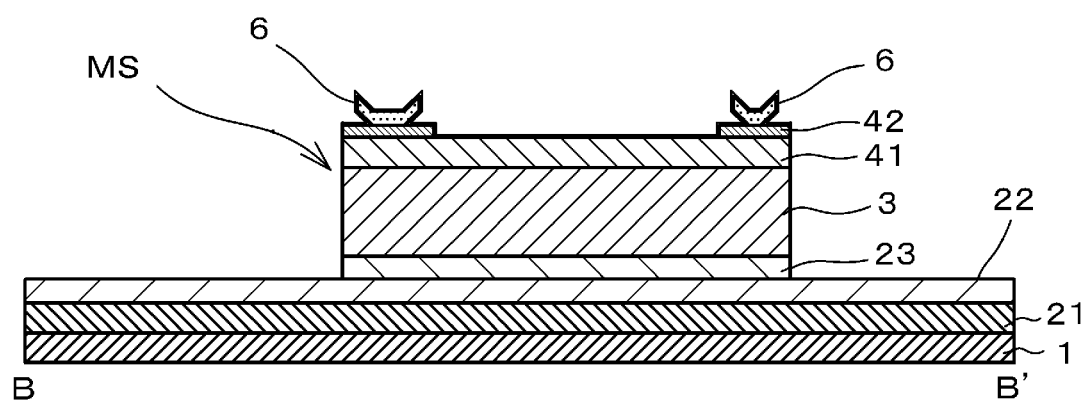

Next, in order to form the mesa portion MS, etching for the first cladding layer 23, the light-receiving layer 3, the second cladding layer 41, and the second contact layer 42 in a predetermined region is performed (see FIGS. 10A and 10B).

Figure 11A:
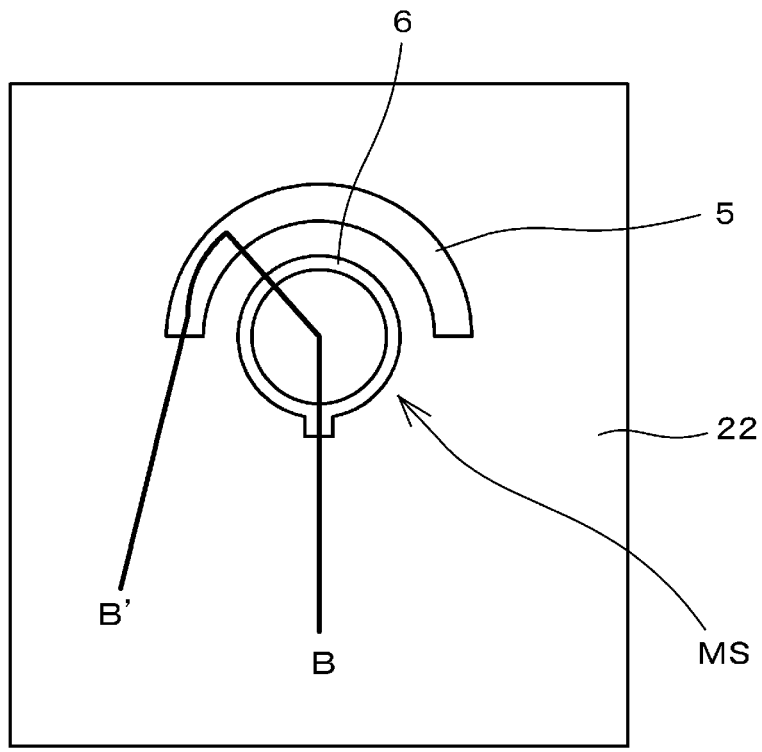
FIGS. 11A and 11B are diagrams following FIGS. 10A and 10B for explaining the manufacturing method for the optical semiconductor element in the first embodiment.
Figure 11B:
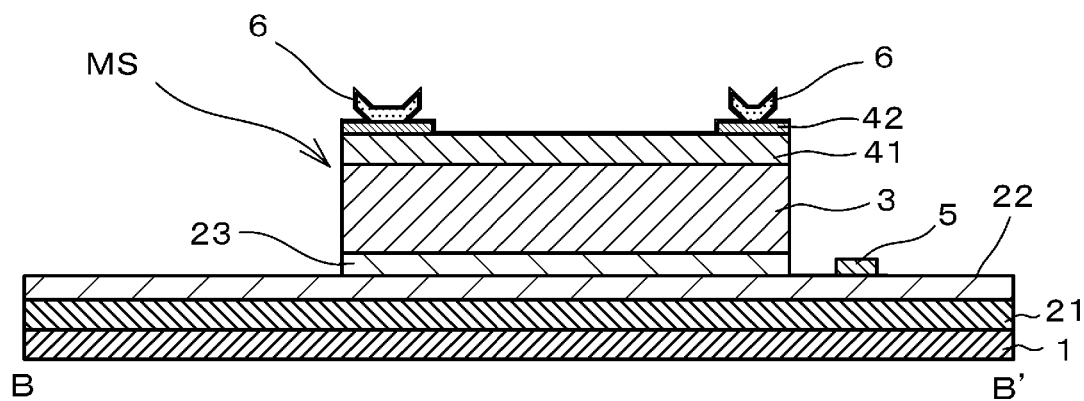

Subsequently, the first contact electrode 5 is formed on the first contact layer 22 (see FIGS. 11A and 11B). More specifically, patterning is performed with resist, and a thin film for forming the first contact electrode 5 is formed thereon, and then lift-off for removing the resist pattern is performed.

Figure 12A:
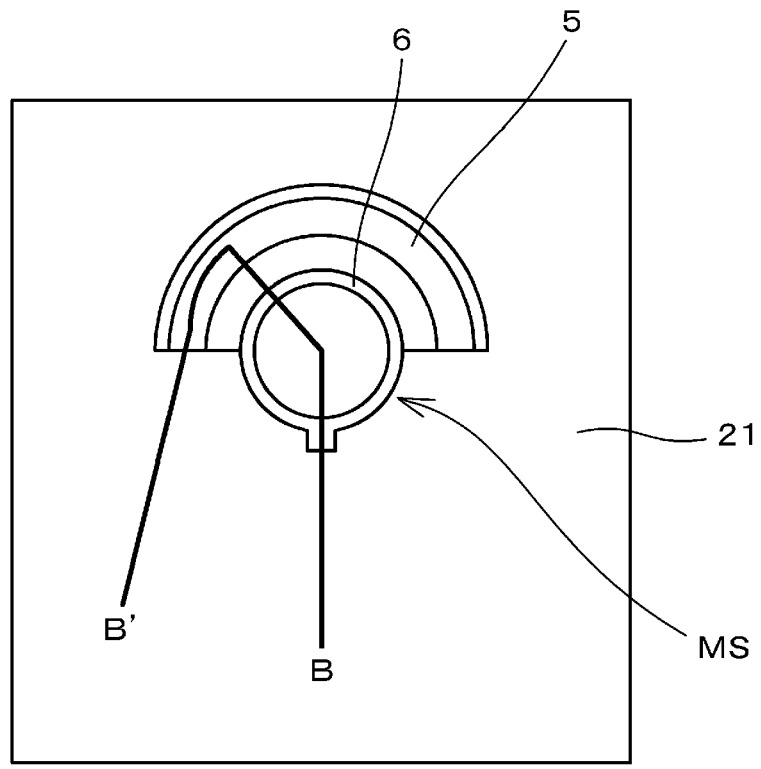
FIGS. 12A and 12B are diagrams following FIGS. 11A and 11B for explaining the manufacturing method for the optical semiconductor element in the first embodiment.
Figure 12B:
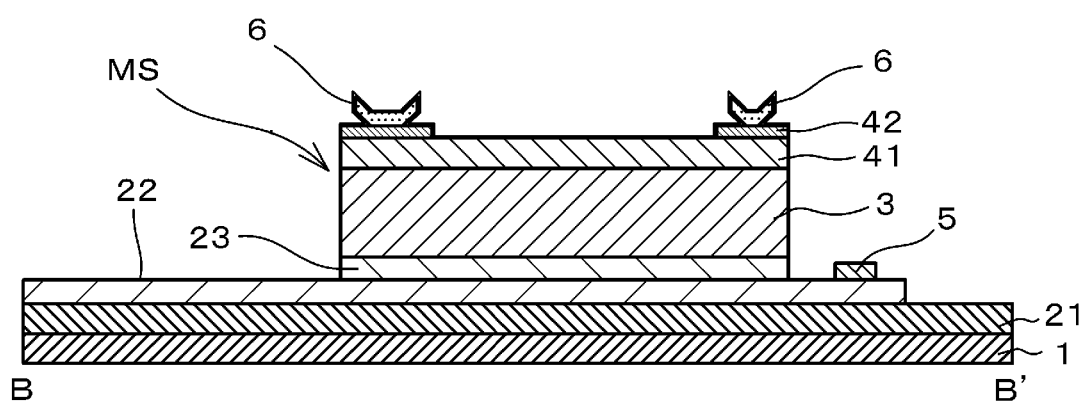

Subsequently, as illustrated in FIGS. 12A and 12B, etching is performed for a predetermined region of the first contact layer 22.

Figure 13A:
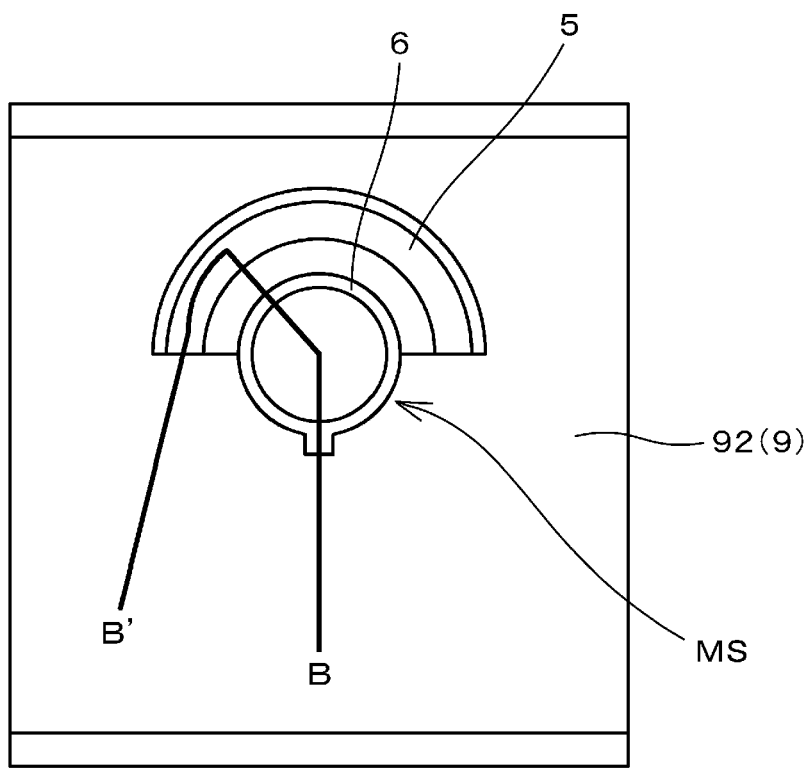
FIGS. 13A and 13B are diagrams following FIGS. 12A and 12B for explaining the manufacturing method for the optical semiconductor element in the first embodiment.
Figure 13B:
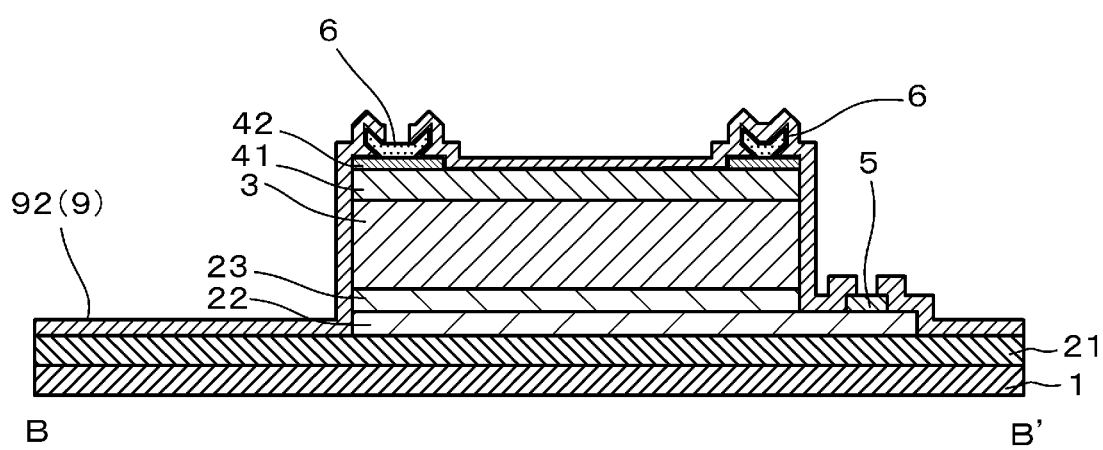

Subsequently, the first insulating film 91 is formed on the upper surface of the mesa portion MS, and then, as illustrated in FIGS. 13A and 13B, the second insulating film 92 is formed so as to substantially cover an entire surface. Note that, since visibility deteriorates, the first insulating film 91 is omitted in FIGS. 13A and 13B. In addition, in the second insulating film 92 formed, an opening is provided in each of a partial region of an upper surface of the first contact electrode 5 and a partial region of an upper surface of the second contact electrode 6. Specifically, on the upper surface of the first contact electrode 5, the opening is provided in a region connected to a first lead-out wire to be formed later. In addition, in the upper surface of the second contact electrode 6, the opening is provided in a region connected to a second lead-out wire to be formed later.

Note that, in the above description, the first insulating film 91 is formed after the predetermined region of the first contact layer 22 is etched, and then the second insulating film 92 is formed, but the order may be switched. That is, after forming the first insulating film 91, the first contact layer 22 may be etched, and then, the second insulating film 92 may be formed.

The second insulating film 92 can be made of, for example, $SiO_2$. However, the second insulating film 92 may be made of $SiN_x$, SiON, or the like.

Note that, the first insulating film 91 and the second insulating film 92 may be formed of the same material.

Figure 14A:
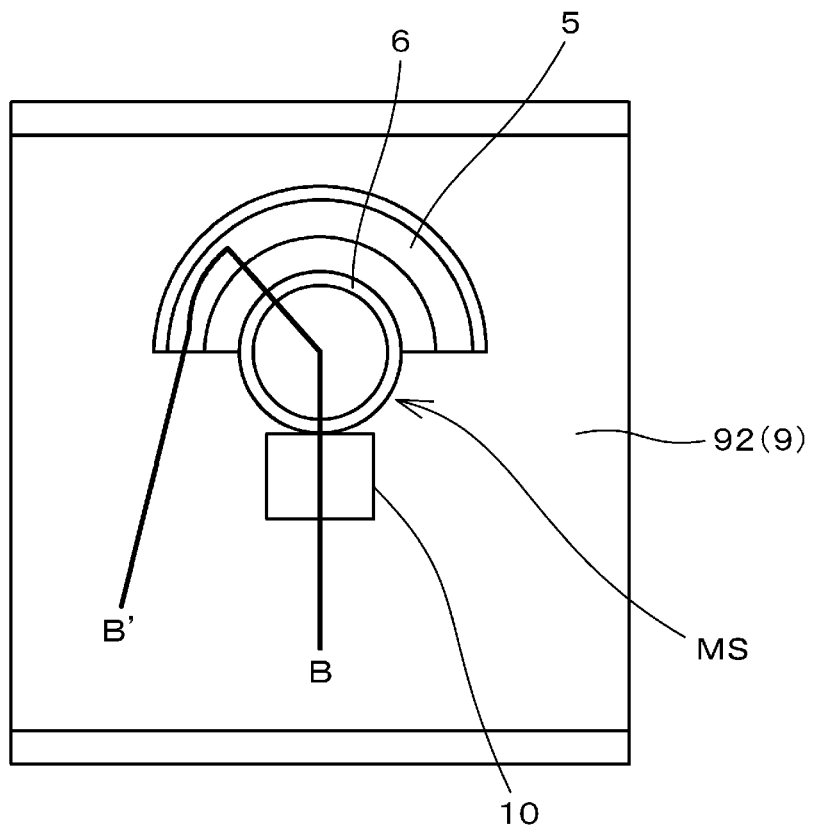
FIGS. 14A and 14B are diagrams following FIGS. 13A and 13B for explaining the manufacturing method for the optical semiconductor element in the first embodiment.
Figure 14B:
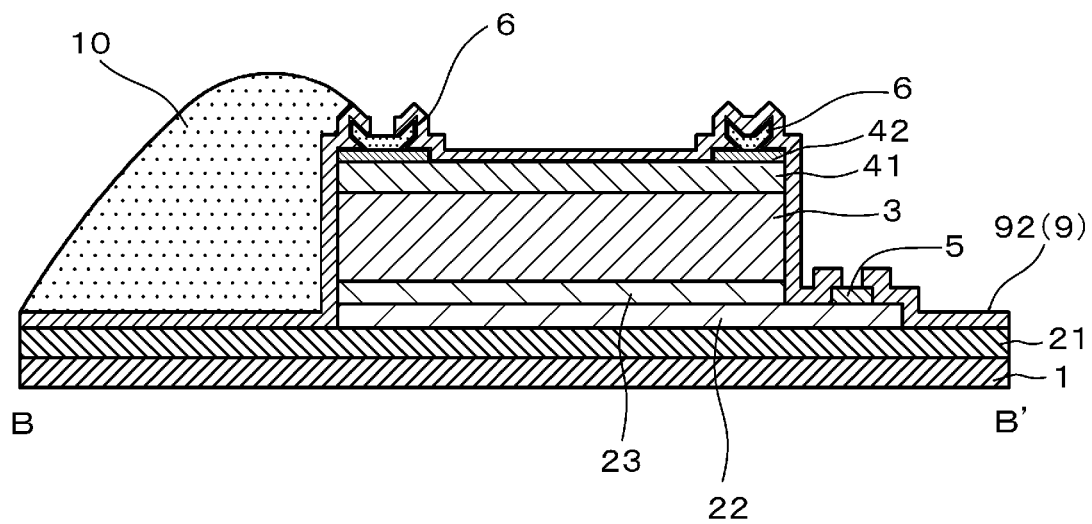

Subsequently, as illustrated in FIGS. 14A and 14B, the slope portion 10 is formed. The slope portion 10 is formed using, for example, the polyimide resin. As described above, the angle θ between the inclined portion to the apex of the slope portion 10 and the planar portion of the semiconductor substrate 1 is set to be equal to or smaller than 65°.

Note that, as illustrated in FIG. 5, when the slope is formed by gently inclining the end face of the mesa portion MS by etching, the process of forming the slope portion 10 described above is unnecessary.

Figure 15A:
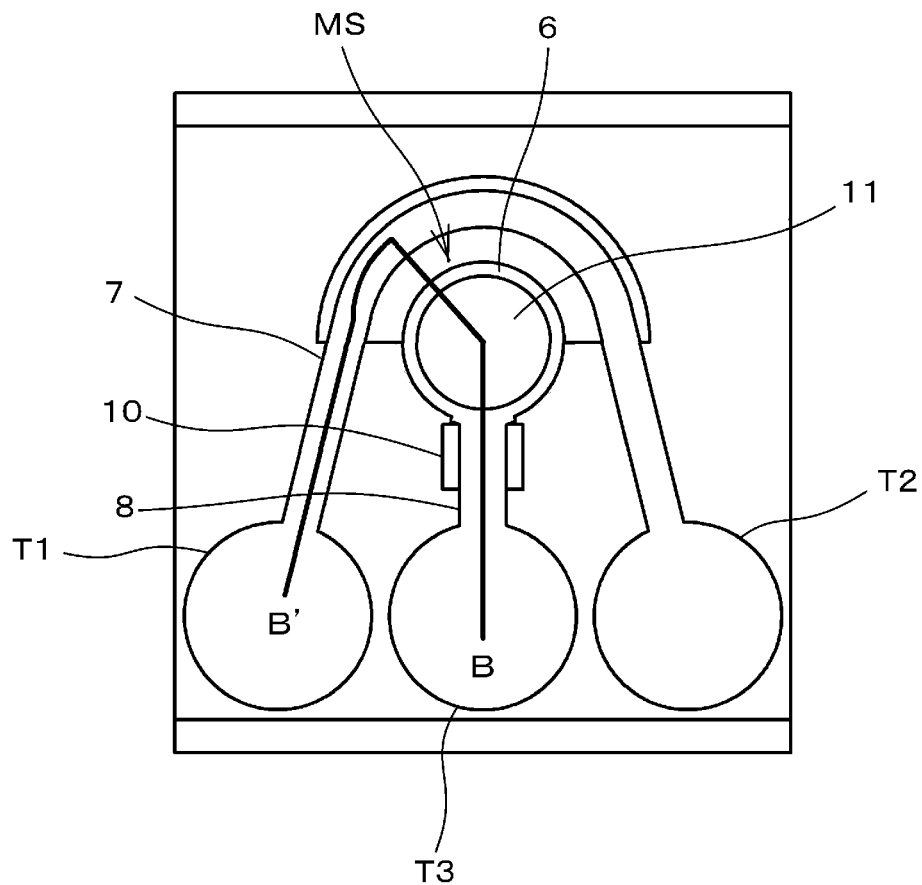
FIGS. 15A and 15B are diagrams following FIGS. 14A and 14B for explaining the manufacturing method for the optical semiconductor element in the first embodiment.
Figure 15B:
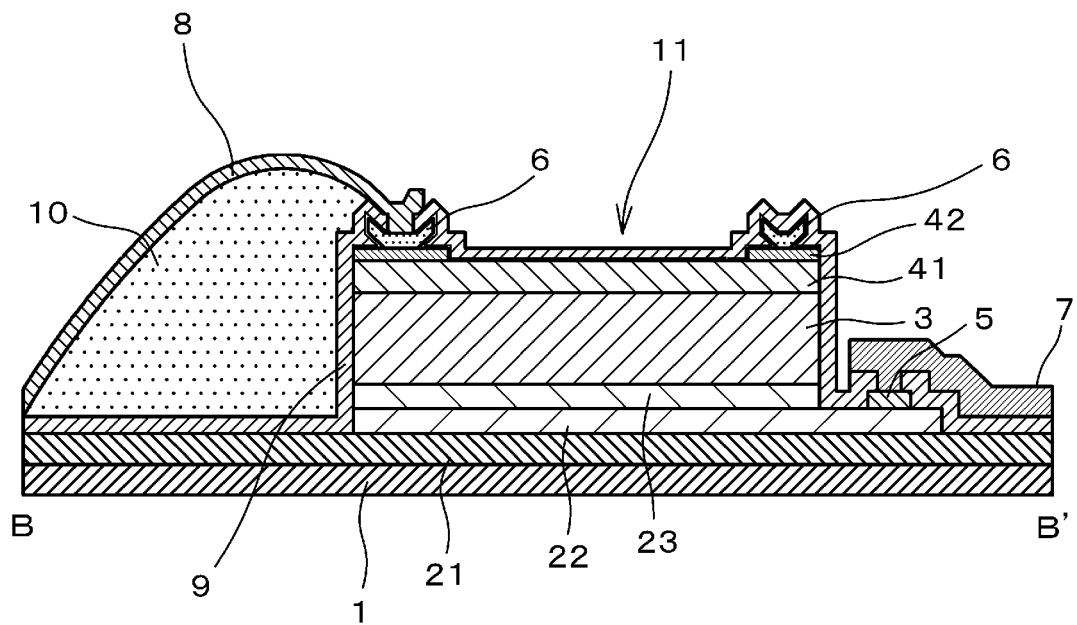

Subsequently, as illustrated in FIGS. 15A and 15B, the first lead-out wire 7, the second lead-out wire 8, the first external connection terminal T1, the second external connection terminal T2, and the third external connection terminal T3 are formed. Specifically, patterning is performed with the resist, and a metal film is formed thereon, and then a lift-off for removing the resist pattern is performed.

The first lead-out wire 7 is connected to the first contact electrode 5 in an opening of the insulating film 9. Further, the second lead-out wire 8 is connected to the second contact electrode 6 in an opening of the insulating film 9.

Thereafter, polishing is performed to obtain a desired thickness, and separation of an element is performed, to complete the optical semiconductor element 100.

Second Embodiment

In the optical semiconductor element 100 in the first embodiment, the second contact electrode 6 has the substantially annular shape in plan view.

On the other hand, in the optical semiconductor element 100 in a second embodiment, a second contact electrode 6A has a substantially annular shape in plan view, and has a structure in which a part of the substantially annular shape is disconnected.

Figure 17:
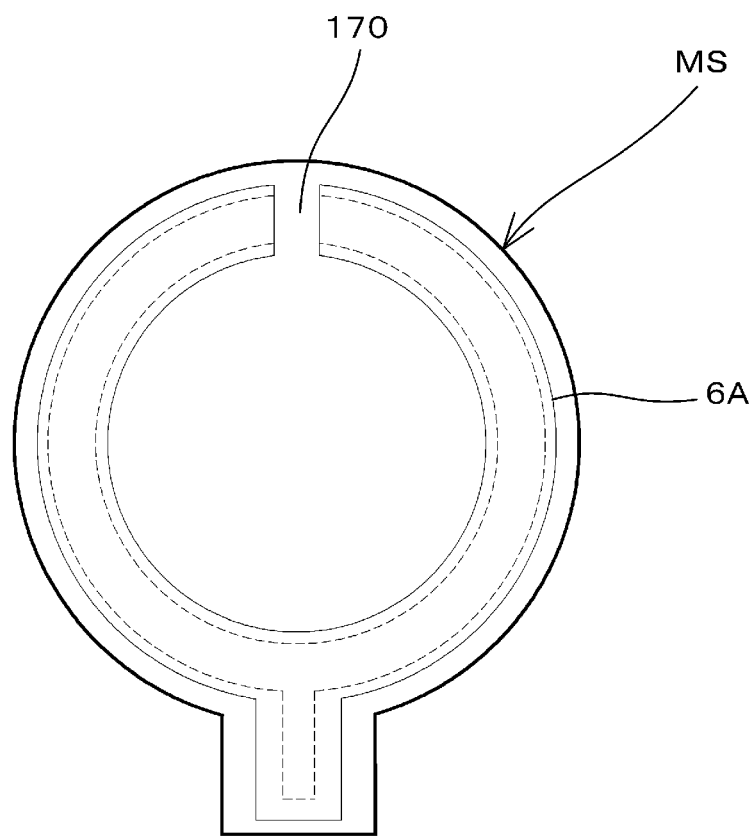
FIG. 17 is a plan view of a mesa portion of an optical semiconductor element in a second embodiment.

FIG. 17 is a plan view of a mesa portion MS of the optical semiconductor element 100 in the second embodiment. The second contact electrode 6A formed on the mesa portion MS has a cutout portion 170 where a part of the substantially annular shape is disconnected. The cutout portion 170 may be provided at any position.

Since the cutout portion 170 is provided in the second contact electrode 6A, in a lift-off process for forming the second contact electrode 6A, it is possible to suppress adhesion of unnecessary metal to a device, and thus occurrence of an appearance defect, light shielding against the light-receiving surface 11, and the like. This will be described with reference to FIGS. 18A and 18B.

Figure 18A:
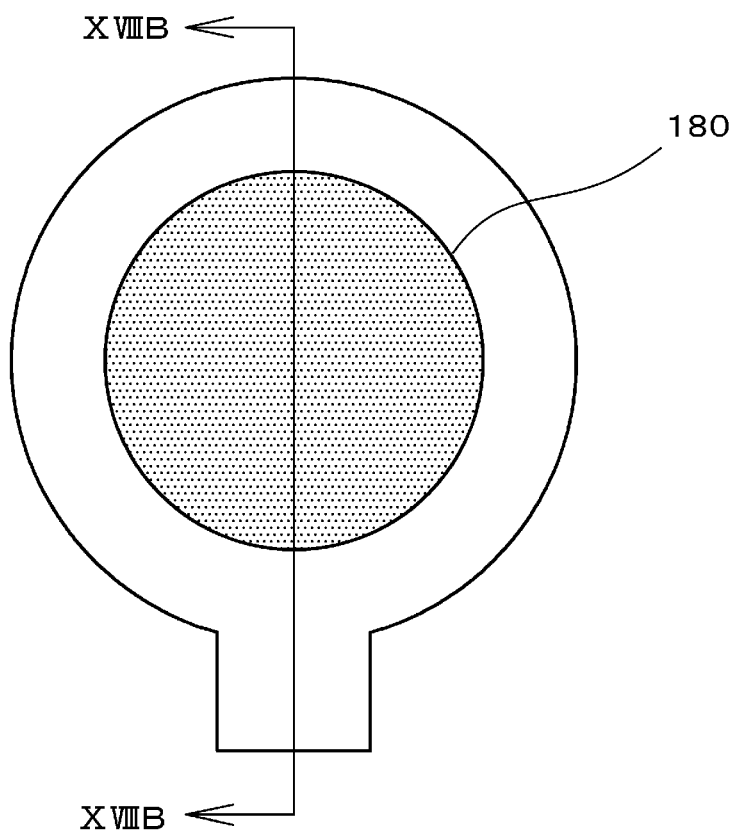
FIGS. 18A and 18B are diagrams for explaining a process of forming a second contact electrode not provided with a cutout portion, such that FIG. 18A is a plan view.
Figure 18B:
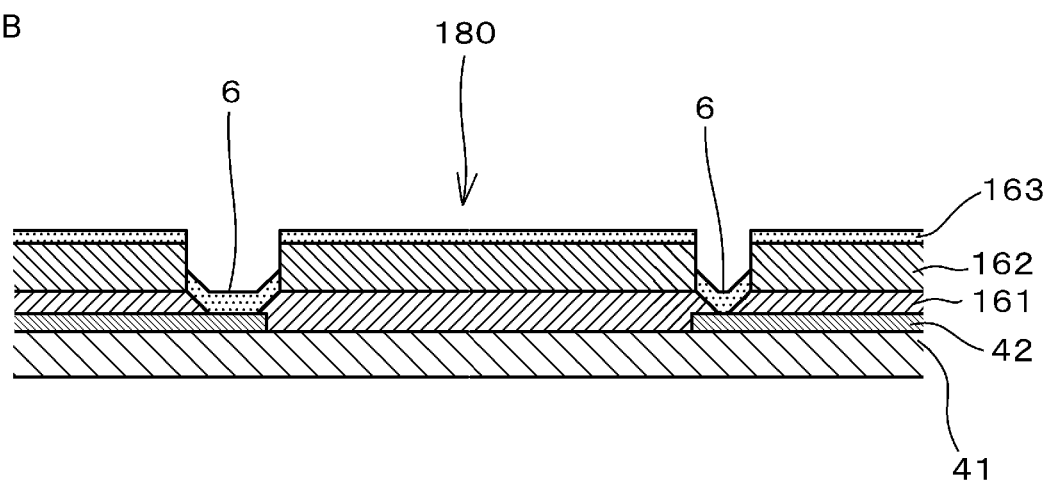

FIGS. 18A and 18B are diagrams for explaining a process of forming a second contact electrode not provided with a cutout portion, such that FIG. 18A is a plan view, and FIG. 18B is a sectional view cut by a line XVIIIB-XVIIIB. More specifically, FIGS. 18A and 18B illustrate a state in which the first resist layer 161, the second resist layer 162, and the thin film 163 illustrated in FIG. 16B are formed.

As illustrated in FIGS. 18A and 18B, when the second contact electrode has a substantially annular shape, a disc-shaped isolated pattern 180 formed of the thin film 163 is formed on the second resist layer 162. This isolated pattern 180 may drift in a solvent and adhere to the device, during the lift-off.

However, in the optical semiconductor element 100 in the second embodiment, the second contact electrode 6A has the substantially annular shape in plan view, and has the structure in which the part of the substantially annular shape is disconnected, thus, the above-described disc-shaped isolated pattern does not occur in the forming process of the second contact electrode 6A. Thus, it is possible to prevent adhesion of an isolated pattern to a device from occurring when a cutout portion is not provided.

Third Embodiment

Figure 19:
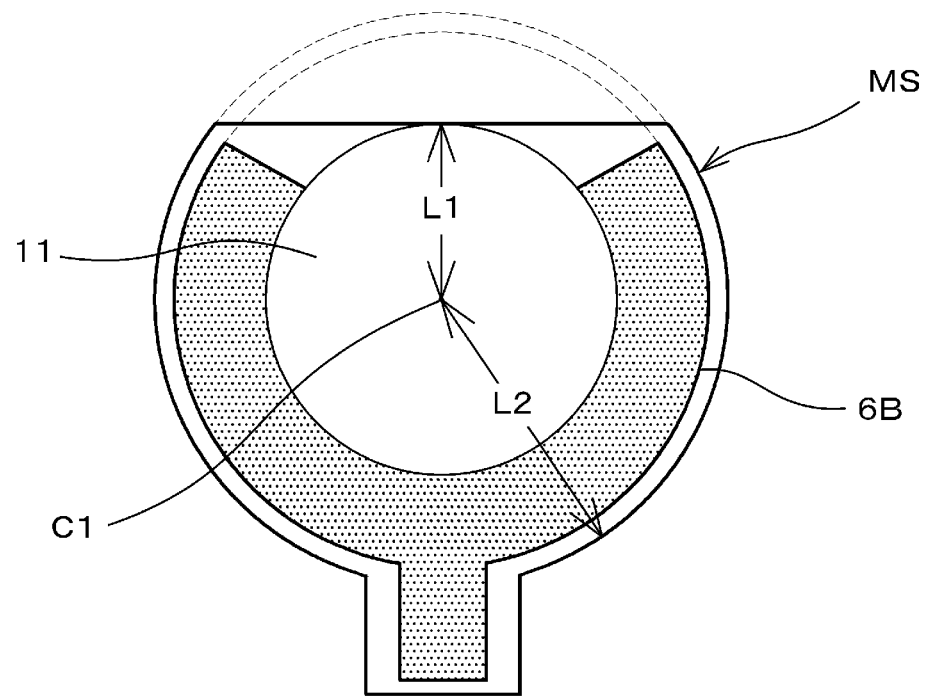
FIG. 19 is a plan view of a mesa portion of an optical semiconductor element in a third embodiment.

FIG. 19 is a plan view of a mesa portion MS of the optical semiconductor element 100 in a third embodiment. Similar to the second contact electrode 6A in the second embodiment, a second contact electrode 6B in the present embodiment also has a substantially annular shape in plan view and has a structure in which a part of the substantially annular shape is disconnected.

The mesa portion MS of the optical semiconductor element 100 in the present embodiment has a shape obtained by removing a part of the mesa portion MS illustrated in FIGS. 4A and 4B. A position where the part is removed is a position at which the substantially annular shape of the second contact electrode 6B is disconnected.

That is, a distance from the center C1 of the light-receiving surface 11 to an outer peripheral end of the mesa portion MS is long at another position, compared to a position where the substantially annular shape is disconnected. In other words, a distance L1 from the center C1 of the light-receiving surface 11 to the outer peripheral end of the mesa portion MS at the position where the substantially annular shape is disconnected is short compared to a distance L2 from the center C1 of the light-receiving surface 11 to the outer peripheral end of the mesa portion MS at a position where the substantially annular shape is not disconnected.

In particular, in the present embodiment, a configuration is adopted in which the distance L1 from the center C1 of the light-receiving surface 11 to the outer peripheral end of the mesa portion MS coincides with a distance from the center C1 of the light-receiving surface 11 to the outer peripheral end of the light-receiving surface 11.

According to the configuration described above, as illustrated in FIG. 19, an area of the mesa portion MS can be reduced, and junction capacitance can be reduced, without reducing an area of the light-receiving surface 11 in plan view. By reducing the junction capacitance, a response speed can be improved, and when the optical semiconductor element 100 is used for, for example, an optical communication system, high-speed communication can be achieved.

The present disclosure is not limited to the above-described embodiments, and various applications and modifications can be made within the scope of the present disclosure.

For example, in the above-described embodiments, it has been described that the first conductivity type is an N-type and the second conductivity type is a P-type, but the first conductivity type may be the P-type, and the second conductivity type may be the N-type.

However, for the following reasons, it is preferable that the P-type semiconductor layer be located in a higher layer than the N-type semiconductor layer as in the above-described embodiments. That is, the P-type semiconductor layer needs to be doped with a P-type dopant at, for example, about $10^{19}$ cm$^{-3}$, but excessive doping deteriorates crystallinity of an epitaxial film. Thus, as in the above-described embodiments, it is preferable to dispose the P-type semiconductor layer in a higher layer than the N-type semiconductor layer.

It has been described that the second contact electrode 6 has the substantially annular shape and surrounds the light-receiving surface 11 in plan view, however, the shape is not limited to the substantially annular shape as long as the second contact electrode 6 has a periphery of an annular shape and surrounds the light-receiving surface 11.

Figure 20:
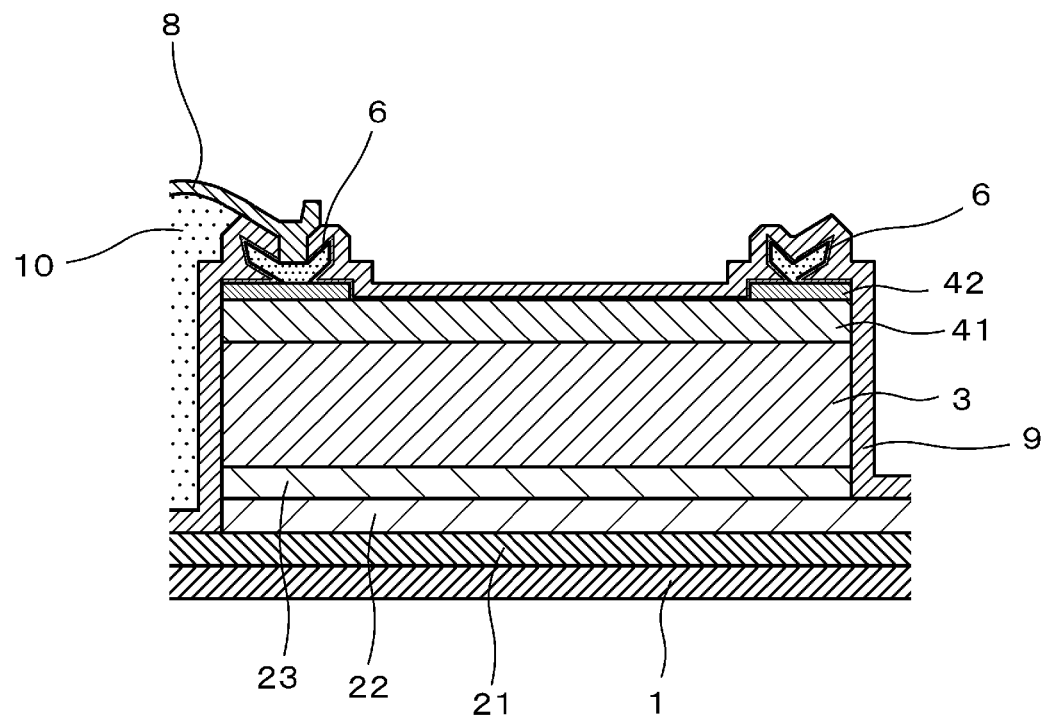
FIG. 20 is a sectional view of a mesa portion when a sectional shape of a second contact electrode is asymmetric.
Figure 21:
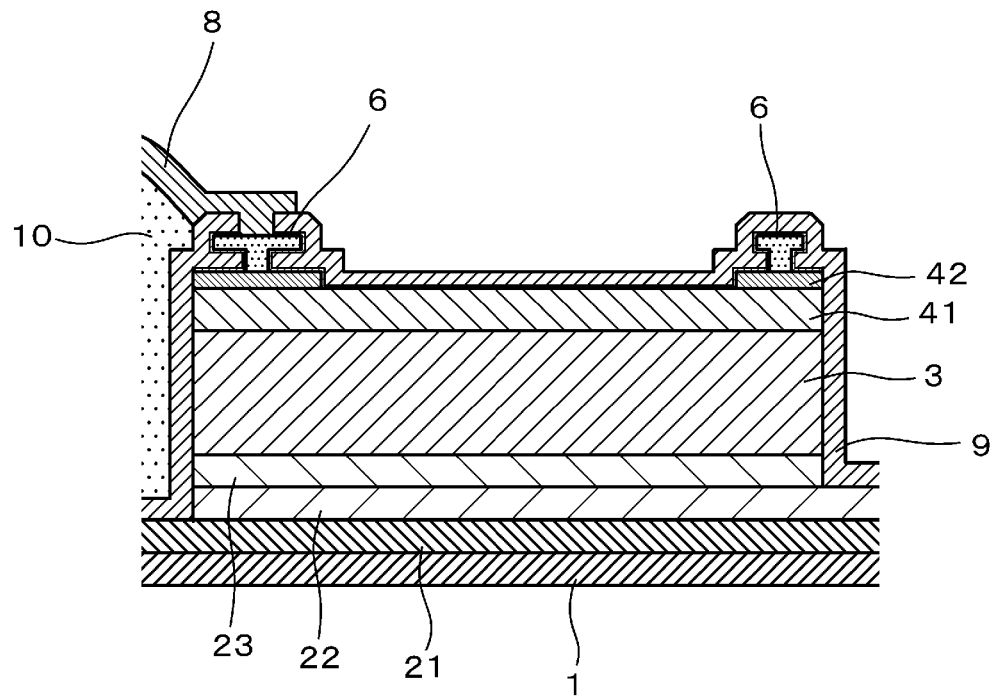
FIG. 21 is a sectional view of a mesa portion when a sectional shape of a second contact electrode is a letter T-shaped.

A sectional shape of the second contact electrode 6 when the mesa portion MS is cut in a vertical direction by a cutting line passing through the center C1 of the light-receiving surface 11 is not limited to the shape illustrated in FIG. 3. For example, the sectional shape of the second contact electrode 6 may have a shape as illustrated in FIG. 20 or 21. The sectional shape of the second contact electrode 6 illustrated in FIG. 21 has a shape of an alphabetical letter T.

The respective sectional shapes of the second contact electrode 6 illustrated in FIG. 3 and FIG. 21 are line-symmetric, but a sectional shape of the second contact electrode 6 illustrated in FIG. 20 is asymmetric. The asymmetric shape is a shape that is neither line-symmetric nor point-symmetric. When the sectional shape of the second contact electrode 6 is asymmetric, a degree of freedom in manufacturing when forming the second contact electrode 6 is improved.

Note that, in the above-described embodiments, the description has been given using, as an optical semiconductor element, a semiconductor light-receiving element in which a light-transmitting surface is the light-receiving surface as an example, but the optical semiconductor element is not limited to the semiconductor light-receiving element. For example, the optical semiconductor element may be a semiconductor light-emitting element in which a light-transmitting surface is a light-emitting surface, that is, a so-called vertical cavity surface emitting laser (VCSEL).

In the embodiments of the present disclosure, the description has been assumed that the first insulating film 91 is made of $SiN_x$ when the insulating film 9 is formed in the two-layer structure, but, the present disclosure is not limited thereto. The first insulating film 91 may be made of, for example, silicon oxide, aluminum oxide, aluminum nitride, silicon oxynitride, SiON, $TiO_2$, $Ta_2O_2$, $Nb_2O_5$, $MgF_2$, $HFO_2$, $ZrO_2$, or the like. Further, it has been described that the second insulating film 92 is made of $SiO_2$, but the present disclosure is not limited thereto, and for example, the second insulating film 92 may be made of $SiO_x$, $Al_2O_3$, AiN, $TiO_2$, $Ta_2O_5$, $MgF_2$, $HfO_2$, $ZrO_2$, or the like. Further, in order to obtain a further effect, three or more insulating films made of respective materials different from one another may be provided.

The forming method for the insulating film is also not limited to the film forming method described in the above-described embodiments, and an ion plating method, spin coating for a monomer, or the like may be used. Examples of the etching method include a dry etching method such as RIE, ion milling and the like, a wet etching method, and the like, and can be used as necessary.

In the optical semiconductor element 100 in the embodiments described above, the first insulating film 91 is formed on the upper surface of the mesa portion MS, but may be formed so as to cover a second contact electrode and the side surface of the semiconductor layer forming the mesa portion MS. A manufacturing method for an optical semiconductor element having such structure will be described with reference to FIG. 22 to FIG. 24.

Figure 22:
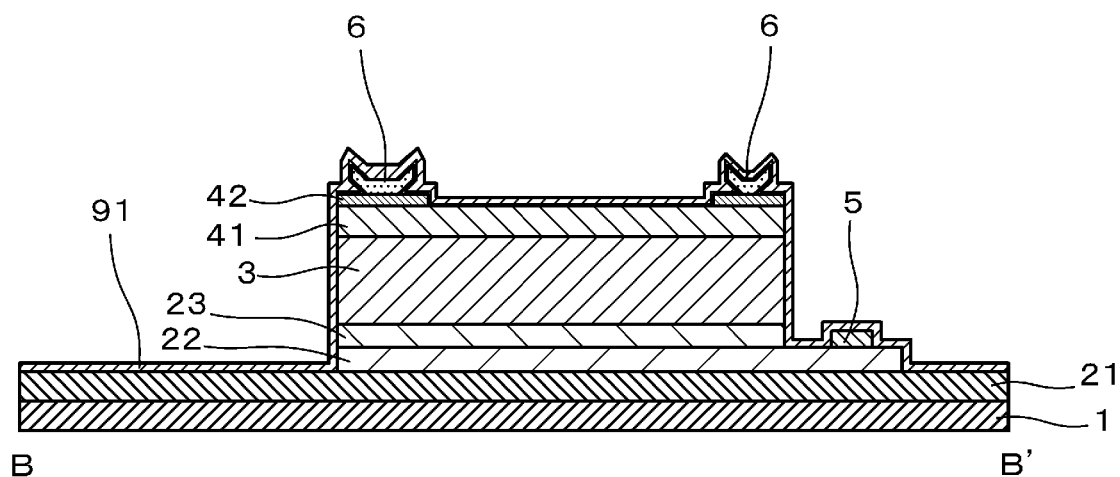
FIG. 22 is a diagram for explaining a manufacturing method for an optical semiconductor element having a structure different from that of the optical semiconductor element of the embodiments described above, and is a diagram for explaining a process performed next to a state illustrated in FIG. 12B.

From a state illustrated in FIG. 12B, the first insulating film 91 is formed so as to substantially cover an entire surface (see FIG. 22). The first insulating film 91 may be made of $SiN_x$, for example.

Figure 23:
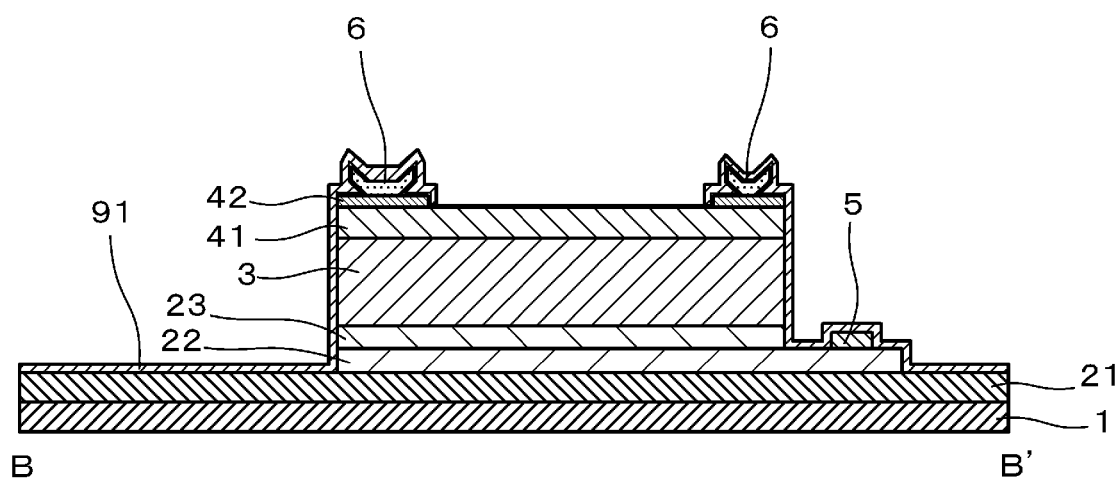
FIG. 23 is a diagram for explaining a process performed next to a state illustrated in FIG. 22.
Figure 24:
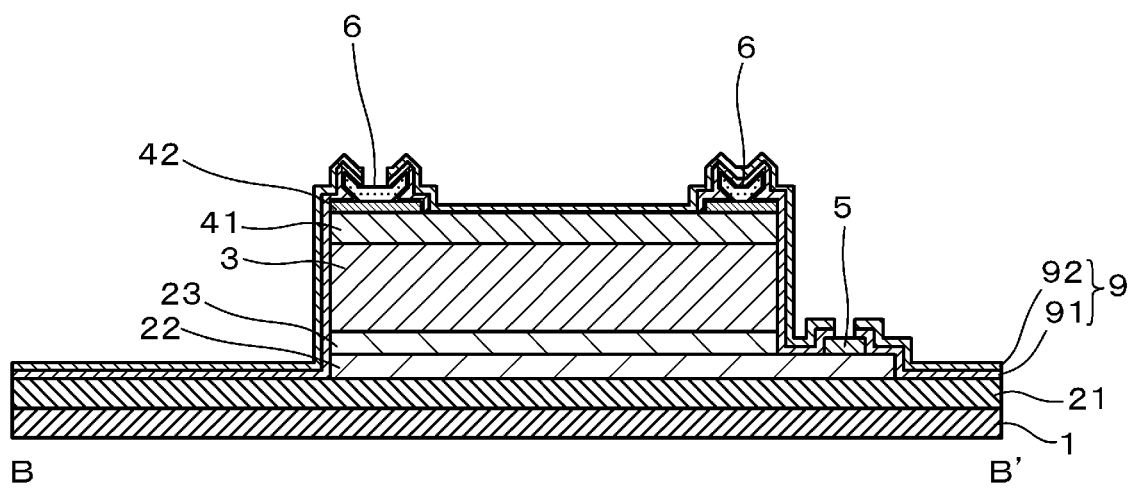
FIG. 24 is a diagram for explaining a process performed next to a state illustrated in FIG. 23.

Next, a predetermined region of the first insulating film 91 is etched (see FIG. 23). The predetermined region is a region to be a light-receiving surface. For the etching, dry etching methods such as RIE, ion milling and the like, or a wet etching method may be used.

Next, the second insulating film 92 is formed so as to substantially cover an entire surface. The second insulating film 92 can be made of, for example, $SiO_2$. In addition, of the formed first insulating film 91 and second insulating film 92, an opening is provided in each of a partial region of an upper surface of the first contact electrode 5 and a partial region of an upper surface of the second contact electrode 6 (see FIG. 24). Subsequent manufacturing processes are the same as the manufacturing processes described in the above-described embodiments.

In the optical semiconductor element manufactured by such a manufacturing method, the portion that covers the side surface of the semiconductor layer of the insulating film is formed of two layers of the first insulating film 91 and the second insulating film 92. In addition, an upper surface of the semiconductor layer except for the position where the second contact electrode 6 of the insulating film is provided, that is, the portion covering the light-receiving surface is formed by one layer of the second insulating film 92. Thus, the thickness of the portion that covers the side surface of the semiconductor layer of the insulating film is larger than the thickness of the portion that covers the upper surface of the semiconductor layer. With such a configuration, it is possible to more effectively suppress entrance of moisture from the side surface of the semiconductor layer.

In addition, the insulating film covering the second contact electrode 6 is formed by the two layers of the first insulating film 91 and the second insulating film 92. Thus, the thickness of the portion that covers the second contact electrode 6 of the insulating film is larger than the thickness of the portion that covers the upper surface of the semiconductor layer. With such a configuration, it is possible to suppress occurrence of a crack in the insulating film due to deterioration, and separation of the insulating film, at an interface of the second contact electrode 6, and to suppress entrance of moisture.

The configurations in the above-described embodiments and the characteristic structure in the modified configuration thereof may be combined as appropriate.

What is claimed is:

1. An optical semiconductor element having a light-transmitting surface, comprising:
   a substrate;
   a semiconductor layer provided on the substrate and configuring a mesa portion;
   a first contact electrode provided in contact with the semiconductor layer;
   a second contact electrode provided on the semiconductor layer so as to surround the light-transmitting surface;
   a first lead-out wire connected to the first contact electrode;
   a second lead-out wire connected to an upper surface of the second contact electrode; and
   an insulating film provided so as to cover at least an upper surface of the semiconductor layer and the second contact electrode, wherein
   an opening is included in the insulating film on the upper surface of the second contact electrode, and the second contact electrode and the second lead-out wire are connected to each other in the opening,
   an outer peripheral end of the second contact electrode in at least a portion where the second contact electrode and the second lead-out wire are connected to each other is located above and outside an outer peripheral end of a connection portion between the second contact electrode and the semiconductor layer, and an inner peripheral end of the second contact electrode is located above and inside an inner peripheral end of the connection portion between the second contact electrode and the semiconductor layer, and
   the insulating film covers an entirety of the upper surface of the second contact electrode except in the opening where the second contact electrode and the second lead-out wire are connected to each other.

2. The optical semiconductor element according to claim 1, wherein
   the second contact electrode has a periphery of an annular shape and surrounds the light-transmitting surface in plan view, and
   in all portions of the periphery, the outer peripheral end of the second contact electrode is located above and outside the outer peripheral end of the connection portion between the second contact electrode and the semiconductor layer, and the inner peripheral end of the second contact electrode is located above and inside the inner peripheral end of the connection portion between the second contact electrode and the semiconductor layer.

3. The optical semiconductor element according to claim 2, wherein
an outer peripheral end of the mesa portion is located outside the outer peripheral end of the second contact electrode.

4. The optical semiconductor element according to claim 2, wherein
the second contact electrode includes a contact metal layer in contact with the semiconductor layer, a barrier metal layer provided on the contact metal layer, and a low-resistance metal layer provided on the barrier metal layer and having resistance lower than resistance of the contact metal layer and the barrier metal layer.

5. The optical semiconductor element according to claim 2, wherein
a sectional shape of the second contact electrode is asymmetric when the mesa portion is cut in a vertical direction by a cutting line passing through a center of the light-transmitting surface.

6. The optical semiconductor element according to claim 2, wherein
the second contact electrode has a periphery of an annular shape and surrounds the light-transmitting surface in plan view, and has a structure in which a part of the periphery is disconnected.

7. The optical semiconductor element according to claim 1, wherein
an outer peripheral end of the mesa portion is located outside the outer peripheral end of the second contact electrode.

8. The optical semiconductor element according to claim 1, wherein
the second contact electrode includes a contact metal layer in contact with the semiconductor layer, a barrier metal layer provided on the contact metal layer, and a low-resistance metal layer provided on the barrier metal layer and having resistance lower than resistance of the contact metal layer and the barrier metal layer.

9. The optical semiconductor element according to claim 8, wherein
the contact metal layer is made of one of Ti and Cr, the barrier metal layer is made of Pt, and the low-resistance metal layer is made of Au.

10. The optical semiconductor element according to claim 1, wherein
the second contact electrode has a periphery of an annular shape and surrounds the light-transmitting surface in plan view, and has a structure in which a part of the periphery is disconnected.

11. The optical semiconductor element according to claim 10, wherein
a distance from a center of the of the light-transmitting surface to an outer peripheral end of the mesa portion at a position where the part of the periphery is disconnected is shorter than a distance from the center of the light-transmitting surface to an outer peripheral end of the mesa portion at a position where the part if the periphery is not disconnected.

12. The optical semiconductor element according to claim 1, wherein
the insulating film is made of $SiN_x$.

13. The optical semiconductor element according to claim 1, wherein
the insulating film has a structure in which a $SiN_x$ layer and a $SiO_2$ layer are laminated.

14. The optical semiconductor element according to claim 1, wherein
a refractive index of the insulating film is from 1.1 to 2.1.

15. The optical semiconductor element according to claim 1, wherein
the mesa portion has a laminated structure of a GaAs layer and an AlGaAs layer.

16. The optical semiconductor element according to claim 1, wherein
the insulating film is provided so as to cover a side surface of the semiconductor layer as well, and
a thickness of a portion of the insulating film covering a side surface of the semiconductor layer is larger than a thickness of a portion of the insulating film covering the upper surface of the semiconductor layer.

17. The optical semiconductor element according to claim 1, wherein
a thickness of a portion of the insulating film covering the second contact electrode is larger than a thickness of a portion of the insulating film covering the upper surface of the semiconductor layer.

18. An optical semiconductor element having a light-transmitting surface, comprising:
a substrate;
a semiconductor layer provided on the substrate and configuring a mesa portion;
a first contact electrode provided in contact with the semiconductor layer;
a second contact electrode provided on the semiconductor layer so as to surround the light-transmitting surface;
a first lead-out wire connected to the first contact electrode;
a second lead-out wire connected to an upper surface of the second contact electrode; and
an insulating film provided so as to cover at least an upper surface of the semiconductor layer and the second contact electrode, wherein
an opening is included in the insulating film on the upper surface of the second contact electrode, and the second contact electrode and the second lead-out wire are connected to each other in the opening,
an outer peripheral end of the second contact electrode in at least a portion where the second contact electrode and the second lead-out wire are connected to each other is located above and outside an outer peripheral end of a connection portion between the second contact electrode and the semiconductor layer, and an inner peripheral end of the second contact electrode is located above and inside an inner peripheral end of the connection portion between the second contact electrode and the semiconductor layer, and
a sectional shape of the second contact electrode is asymmetric when the mesa portion is cut in a vertical direction by a cutting line passing through a center of the light-transmitting surface.

19. An optical semiconductor element having a light-transmitting surface, comprising:
a substrate;
a semiconductor layer provided on the substrate and configuring a mesa portion;
a first contact electrode provided in contact with the semiconductor layer;
a second contact electrode provided on the semiconductor layer so as to surround the light-transmitting surface;
a first lead-out wire connected to the first contact electrode;

a second lead-out wire connected to an upper surface of the second contact electrode;

an insulating film provided so as to cover at least an upper surface of the semiconductor layer and the second contact electrode; and a slope portion under the second lead-out wire, wherein an opening is included in the insulating film on the upper surface of the second contact electrode, and the second contact electrode and the second lead-out wire are connected to each other in the opening, an outer peripheral end of the second contact electrode in at least a portion where the second contact electrode and the second lead-out wire are connected to each other is located above and outside an outer peripheral end of a connection portion between the second contact electrode and the semiconductor layer, and an inner peripheral end of the second contact electrode is located above and inside an inner peripheral end of the connection portion between the second contact electrode and the semiconductor layer, and an apex of the slope portion is located at a position higher than an upper end of the second contact electrode.

20. The optical semiconductor element according to claim 19, wherein an angle between an inclined portion up to the apex of the slope portion and a planar portion on the substrate is equal to or smaller than 65°.

* * * * *